(12) United States Patent
Nakamura

(10) Patent No.: US 11,527,576 B2
(45) Date of Patent: Dec. 13, 2022

(54) NONVOLATILE SEMICONDUCTOR STORAGE DEVICE AND MANUFACTURING METHOD THEREOF

(71) Applicant: Kioxia Corporation, Tokyo (JP)

(72) Inventor: Yuna Nakamura, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 135 days.

(21) Appl. No.: 17/010,425

(22) Filed: Sep. 2, 2020

(65) Prior Publication Data

US 2021/0265426 A1  Aug. 26, 2021

(30) Foreign Application Priority Data

Feb. 20, 2020  (JP) .............................. JP2020-026906

(51) Int. Cl.
| | |
|---|---|
| *H01L 47/00* | (2006.01) |
| *H01L 27/24* | (2006.01) |
| *G11C 13/00* | (2006.01) |
| *H01L 45/00* | (2006.01) |
| *G11C 5/02* | (2006.01) |

(52) U.S. Cl.
CPC .......... *H01L 27/2481* (2013.01); *G11C 5/025* (2013.01); *G11C 13/0002* (2013.01); *H01L 45/1253* (2013.01); *H01L 45/16* (2013.01)

(58) Field of Classification Search
CPC . H01L 27/2481; H01L 45/1253; G11C 5/025; G11C 13/0002
See application file for complete search history.

(56) References Cited

U.S. PATENT DOCUMENTS

2013/0237028 A1   9/2013   Furuhashi
2013/0248796 A1   9/2013   Inokuma

FOREIGN PATENT DOCUMENTS

JP     2013-201405 A    10/2013

*Primary Examiner* — Samuel A Gebremariam
(74) *Attorney, Agent, or Firm* — Foley & Lardner LLP

(57) ABSTRACT

A method for manufacturing a nonvolatile semiconductor storage device includes: forming a first conductive layer by self-alignment on a first wiring layer, and performing an annealing processing; stacking a first stacked film on the first conductive layer; processing the first stacked film, the first conductive layer, and the first wiring layer into a stripe structure extending in a first direction; forming and planarizing a first interlayer insulating film; forming a second wiring layer; forming a second conductive layer by self-alignment on the second wiring layer, and performing an annealing processing; processing the second wiring layer and the second conductive layer into a stripe structure extending in a second direction intersecting the first direction; and processing the first stacked film and the first interlayer insulating film below and between the second wiring layer, and forming a first memory cell having the first stacked film in a columnar shape.

10 Claims, 28 Drawing Sheets

NONVOLATILE SEMICONDUCTOR STORAGE DEVICE AND MANUFACTURING METHOD THEREOF

CROSS-REFERENCE TO RELATED APPLICATION(S)

This application is based upon and claims the benefit of priority from. Japanese Patent Application No. 2020-026906, filed Feb. 20, 2020, the entire contents of which are incorporated herein by reference.

FIELD

Embodiments described herein relate generally to a nonvolatile semiconductor storage device and a manufacturing method thereof.

BACKGROUND

In recent years, a resistive random access memory (ReRAM) using a resistance change of a film has been developed. As a type of the ReRAM, a phase-change memory (PCM) using a change in a resistance value due to thermal phase transition between a crystalline state and an amorphous state in a storage region of the film has been developed. In addition, since a superlattice PCM in which two different alloys are repeatedly stacked can change a phase of the film with a small current, attention has been paid to a storage device that easily saves power.

DETAILED DESCRIPTION

Figure 1:
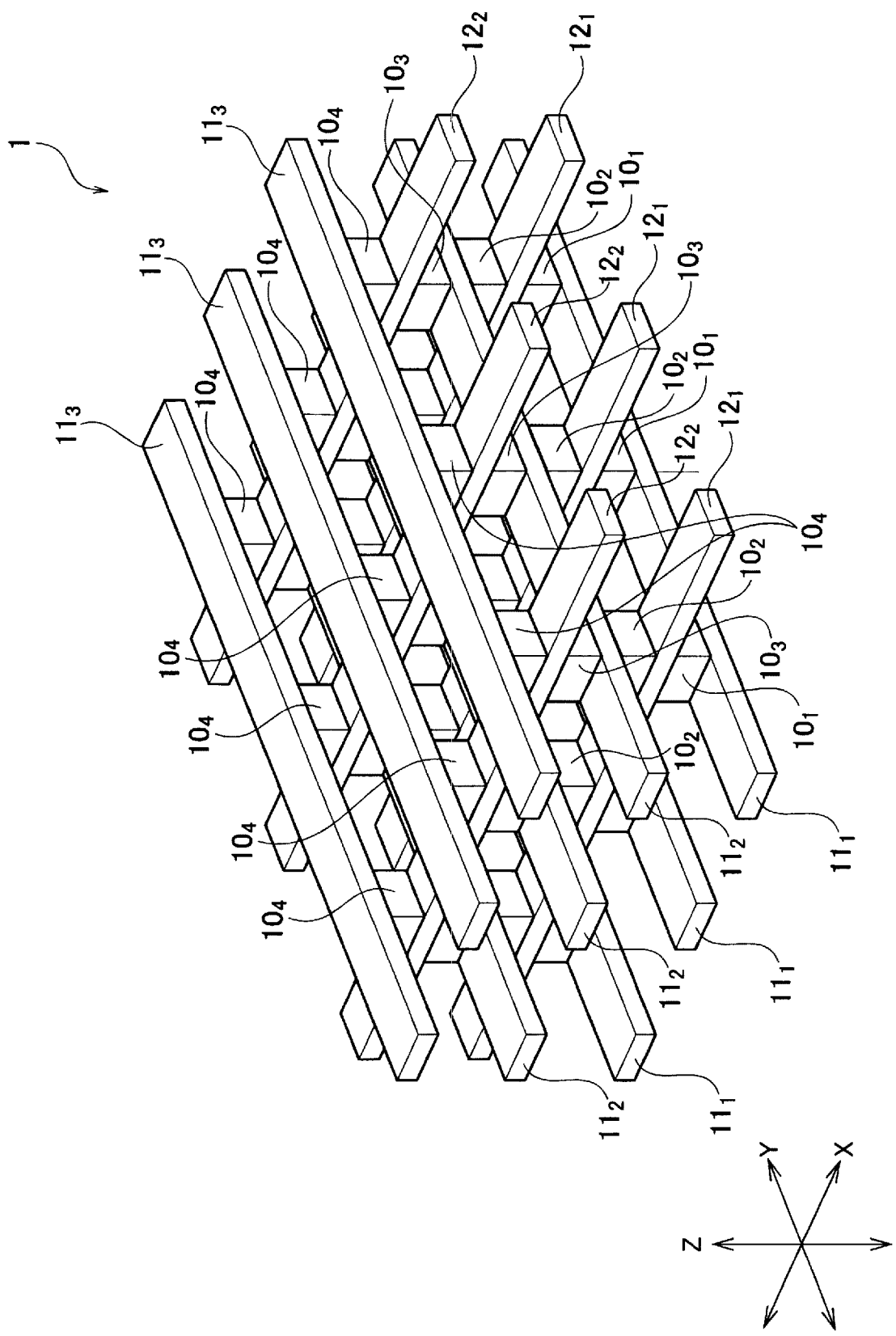
FIG. 1 shows schematic bird's-eye view configuration diagram of a nonvolatile semiconductor storage device according to at least one embodiment.

At least one embodiment provides a nonvolatile semiconductor storage device and a manufacturing method thereof capable of preventing generation of a void and capable of reducing wiring resistance.

In general, according to at least one embodiment, a method for manufacturing a nonvolatile semiconductor storage device includes: forming a first conductive layer by self-alignment on a first wiring layer, and performing an annealing processing; stacking a first stacked film on the first conductive layer; processing the first stacked film, the first conductive layer, and the first wiring layer into a stripe structure extending in a first direction; forming and planarizing a first interlayer insulating film; forming a second wiring layer; forming a second conductive layer by self-alignment on the second wiring layer, and performing an annealing processing; processing the second wiring layer and the second conductive layer into a stripe structure extending in a second direction intersecting the first direction; and processing the first stacked film and the first interlayer insulating film below and between the second wiring layer, and forming a first memory cell having the first stacked film in a columnar shape.

Next, embodiments will be described with reference to the drawings. In the description of the drawings described below, the same or similar parts are denoted by the same or similar reference numerals. However, it should be noted that the drawings are schematic, and a relationship between thickness of each component and a planar dimension is different from an actual one. Therefore, specific thicknesses and dimensions should be determined in consideration of the following description. In addition, the drawings also include portions having different dimensional relationships and ratios from each other.

In addition, the embodiments described below illustrate devices and methods for embodying technical ideas, and do not specify a material, shape, structure, arrangement, and the like of each component. Various modifications may be made to the embodiments within the scope of the claims.

Embodiments

Figure 2:
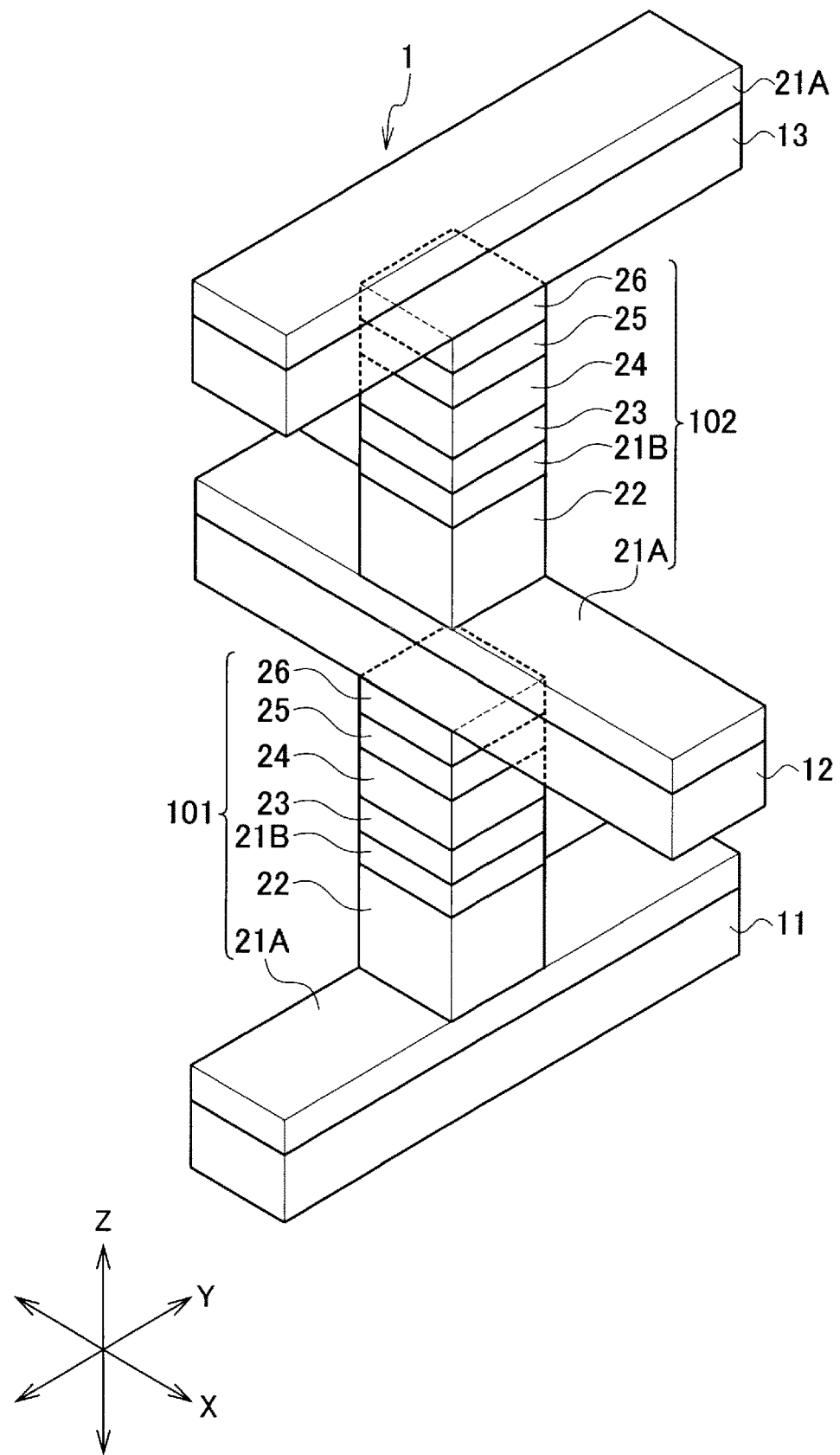
FIG. 2 is a schematic bird's-eye view configuration diagram of two-stage components of a memory cell of FIG. 1.

A schematic bird's-eye view configuration of a nonvolatile semiconductor storage device 1 according to at least one embodiment is shown in FIG. 1, and for example, four layers are stacked in an array of 3 rows×3 columns. A schematic bird's-eye view configuration of two-stage components of a memory cell of FIG. 1 is shown in FIG. 2. In the structure of FIG. 1, a memory cell of n-th (n is a natural number) layer, a first wiring layer of n-th layer, and a second wiring layer of n-th layer are shown as $10_n$, $11_n$, and $12_n$, respectively. In the following description, a plurality of memory cells, a plurality of first wiring layers, and a plurality of second wiring layers may be simply denoted as 10, 11, and 12 in some cases.

The nonvolatile semiconductor storage device 1 according to at least one embodiments has, as shown in FIG. 1, a cross-point memory structure, and includes a plurality of first wiring layers 11 disposed on the same plane, a plurality of second wiring layers 12 disposed on the same plane above the plurality of first wiring layers 11 and three-dimensionally intersecting the plurality of first wiring layers 11, and memory cells 10 disposed between the second wiring layers 12 and the first wiring layers 11 at portions where the plurality of second wiring layers 12 intersect the plurality of first wiring layers 11. The nonvolatile semiconductor storage device 1 according to at least one embodiment may be disposed on, for example, an insulating substrate including an insulating layer formed on a semiconductor substrate.

The first wiring layer 11 and the second wiring layer intersect each other non-parallelly and three-dimensionally. For example, as shown in FIG. 1, a plurality of memory cells 10 are disposed in a matrix in a two-dimensional direction (X and Y directions), and further, a plurality of matrix arrays are stacked in a Z direction orthogonal to an XY plane. One first wiring layer 11 is shared between upper and lower memory cells 10, and similarly, one second wiring layer 12 is shared between upper and lower memory cells 10. In FIG. 1, illustration of conductive layers 21A disposed on the first wiring layers 11 and the second wiring layers 12 are omitted.

Interlayer insulating films are disposed between the plurality of first wiring layers 11 and the plurality of second wiring layers 12, and illustration thereof is omitted.

In the following description, the first wiring layer 11 may be referred to as a lower wiring layer or a bit line, and the second wiring layer 12 may be referred to as an upper wiring layer or a word line. In addition, the cross-point memory structure can be stacked in a plurality of layers. The names of the bit line and the word line may be reversed.

Any of a resistive random access memory (ReRAM), a phase-change memory (PCM), a ferroelectric random access memory (FeRAM), and the like may be applied to the nonvolatile semiconductor storage device according to at least one embodiment. In addition, magneto-tunnel junction (MTJ) resistance change elements are also applicable. In the following description, the PCM will be mainly described.

(Configuration of Memory Cell)

As shown in FIG. 2, the memory cell 10 of the nonvolatile semiconductor storage device according to at least one embodiment includes the first wiring layer 11, the conductive layer 21A formed on the first wiring layer 11, the second wiring layer 12, the conductive layer 21A formed on the second wiring layer 12, and a storage element and a selector 22 connected in series between the first wiring layer 11 and the second wiring layer 12. The storage element includes a resistance change film 24. As shown in FIG. 2, the conductive layers 21A are disposed on the first wiring layer 11 and the second wiring layer 12. The first wiring layer 11 and the second wiring layer 12 may have a two-layer structure.

A first memory cell 101 disposed between the second wiring layer 12 and the first wiring layer 11 includes stacked films (21A, 22, 21B, 23, 24, 25, 26), and a second memory cell 102 disposed between a third wiring layer 13 and the second wiring layer 12 includes, similarly, stacked films (21A, 22, 21B, 23, 24, 25, 26). The first memory cell 101 and the second memory cell 102 correspond to the memory cell 10 as shown in FIG. 1, but are distinguished from each other for convenience of description. Similarly, the third wiring layer 13 corresponds to the first wiring layer 11 as shown in FIG. 1, but is distinguished from the first wiring layer 11 for ease of description.

The selector 22 may be, for example, a switch element between two terminals. When a voltage applied between the two terminals is equal to or lower than a threshold voltage, the switch element is in a "high resistance" state, for example, an electrically nonconductive state. When the voltage applied between the two terminals is equal to or higher than the threshold voltage, the switch element changes to a "low resistance" state, for example, an electrically conductive state. The switch element may have the function regardless of a polarity of the voltage. This switch element contains at least one chalcogen element selected from the group consisting of tellurium (Te), selenium (Se), and sulfur (S). Alternatively, the switch element may contain chalcogenide, which is a compound containing the above chalcogen element. In addition to the above elements, the switch element may also contain at least one element selected from the group consisting of boron (B), aluminum (Al), gallium (Ga), indium (In), carbon (C), silicon (Si), germanium (Ge), tin (Sn), arsenic (As), phosphorus (P), and antimony (Sb).

The selector 22 may be implemented by, for example, a silicon diode having a p-intrinsic-n (PIN) structure.

The resistance change film 24 can be electrically switched between a relatively low resistance state (set state) and a relatively high resistance state (reset state), and stores data in a nonvolatile manner. The selector 22 prevents a sneak current when electrically accessing (forming/writing/erasing/reading) a selected memory cell.

The resistance change film 24 contains, for example, a metal oxide. As the metal oxide, for example, an oxide of one kind of metal or an alloy of two or more kinds of metals selected from the group consisting of zirconium (Zr), titanium (Ti), aluminum (Al), hafnium (Hf), manganese (Mn), tantalum (Ta), and tungsten (W) may be used.

When the memory cell 10 is formed as a superlattice PCM, the resistance change film 24 is formed by a superlattice structure in which a plurality layers of chalcogenide compounds are stacked. The chalcogenide compound used for the resistance change film 24 is formed of two or more kinds of chalcogenide compounds such as antimony tellurium such as $Sb_2Te_3$ and germanium tellurium such as GeTe. In order to stabilize a phase change, one kind of the chalcogenide compound preferably contains antimony (Sb) or bismuth (Bi). The selector 22 is formed of a transition metal chalcogenide compound. This chalcogenide compound is, for example, a compound of one or more transition metals selected from the group consisting of titanium (Ti), vanadium (V), copper (Cu), zinc (Zn), chromium (Cr), zirconium (Zr), platinum (Pt), palladium (Pd), molybdenum (Mo), nickel (Ni), manganese (Mn) and hafnium (Hf) and one or more chalcogen elements selected from the group consisting of sulfur (S), selenium (Se) and tellurium (Te). More preferably, the chalcogenide compound is a compound whose composition is represented by a chemical formula MX or $MX_2$, where M is a transition metal and X is a chalcogen element. When the composition is MX, a concentration of the transition metal M in the chalcogenide compound is 50 atomic %, and when the composition is $MX_2$, the concentration of the transition metal M is 33 atom %. However, since the composition of the compound has an allowable range, a suitable concentration of the transition metal M in the chalcogenide compound is 20 atomic % or more and 60 atomic % or less. In at least one embodiment, the chalcogenide compound is $TiTe_2$, for example.

The resistance change film 24 is sandwiched between the conductive film 25 and the conductive film 23. The conductive film 25 and the conductive film 23 each include a metal film or a metal nitride film. For example, a titanium nitride film or carbon may be used as the conductive film 25 or the conductive film 23.

The electrode layer 26 is disposed between the conductive film 25 and the second wiring layer 12. For the electrode layer 26, for example, W, Ti, Ta, or nitrides thereof may be applied. The resistance change film 24 may be formed of Si, and the electrode layer 26 may be formed of Ni or Pt. Materials of the first wiring layer 11 and the second wiring layer 12 will be described later.

The conductive film 21B is disposed between the conductive film 23 and the selector 22. The conductive film 21B may contain a conductive material such as carbon, titanium nitride (TiN), W, Cu, or Al.

The conductive layer 21A formed on the first wiring layer 11 is disposed between the first wiring layer 11 and the selector 22. The conductive layer 21A includes a carbon or carbon nitride film. The conductive layer 21A may contain a conductive material such as titanium nitride (TiN), W, Cu, or Al. The conductive layer 21A is electrically connected to the first wiring layer 11.

The conductive layer 21A prevents diffusion of elements between upper and lower layers sandwiching the conductive layer 21A. After the conductive layer 21A is formed on the first wiring layer 11, the generation of voids between the conductive layer 21A and a film forming the subsequent selector 22 can be prevented and adhesion therebetween can be enhanced by performing an annealing processing in advance.

The conductive films 21B, 23, and 25 prevent diffusion of elements between upper and lower layers sandwiching the conductive films 21B, 23, and 25. The conductive films 21B, 23, and 25 enhance the adhesion between the upper and lower layers sandwiching the conductive films 21, 23, and 25.

When a reset voltage is applied to the resistance change film 24 in a low resistance state (the set state) having a relatively low resistance through the first wiring layer 11 and the second wiring layer 12, the resistance change film 24 can be switched to a high resistance state (the reset state) having a relatively high resistance. When a set voltage higher than the reset voltage is applied to the resistance change film 24 having the high resistance state (the reset state), the resistance change film 24 can be switched to the low resistance state (the set state).

Figure 3:
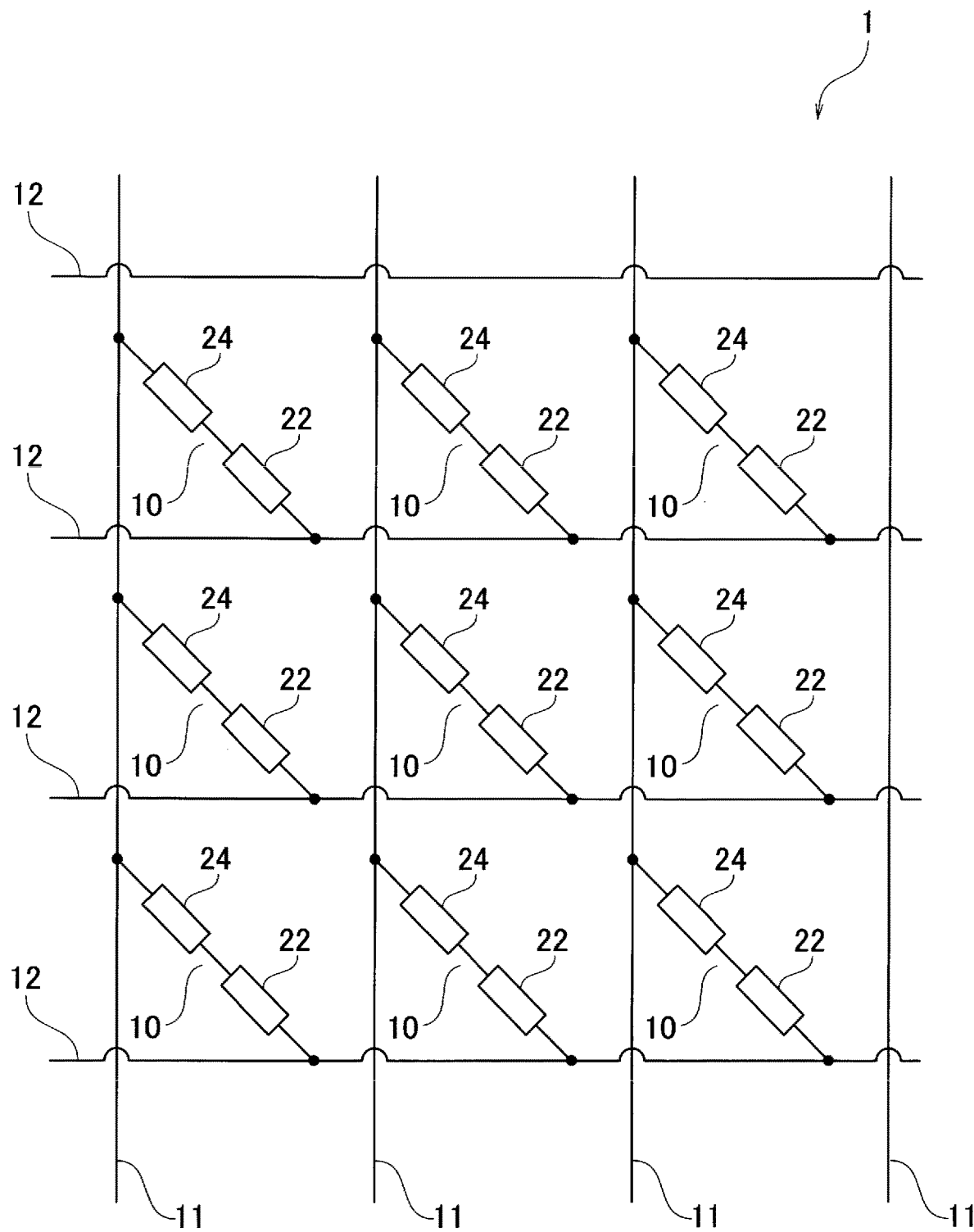
FIG. 3 is a circuit configuration diagram of the nonvolatile semiconductor storage device according to at least one embodiment.

In a basic circuit configuration of the nonvolatile semiconductor storage device 1 according to at least one embodiment, as shown in FIG. 3, the memory cell 10 is connected to a cross point between the first wiring layer 11 and the second wiring layer 12. In FIG. 3, the memory cell 10 is represented as a series configuration including the resistance change film 24 and the selector 22. Since the nonvolatile semiconductor storage device 1 has, for example, four-layer stacked structure as shown in FIG. 1, four layers of the circuit configuration shown in FIG. 3 are stacked in this case.

Figure 4:
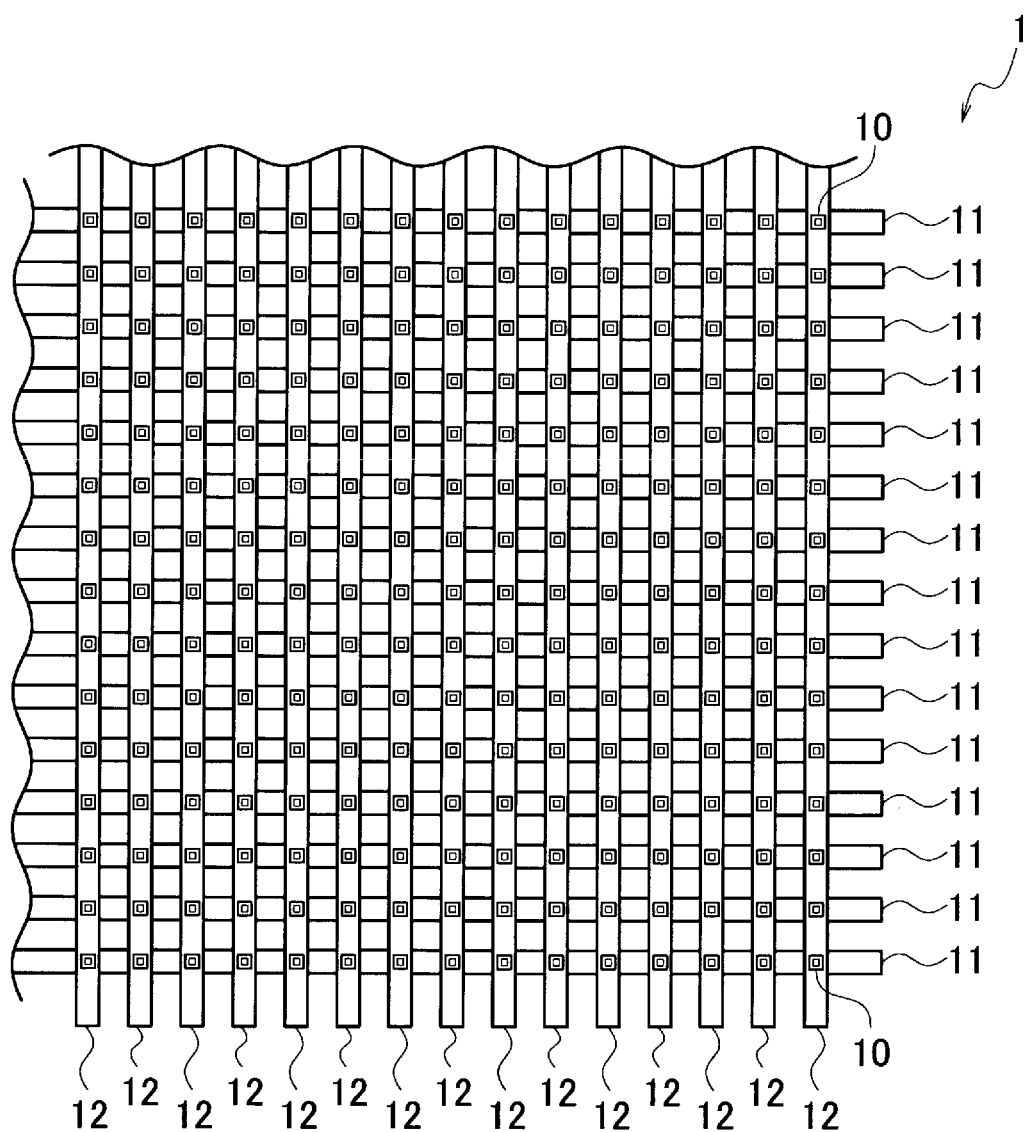
FIG. 4 is a schematic plan pattern configuration diagram of the nonvolatile semiconductor storage device according to at least one embodiment.

As shown in FIG. 4, a schematic plan pattern configuration example of the nonvolatile semiconductor storage device 1 according to at least one embodiment includes a plurality of first wiring layers (bit lines) 11, a plurality of second wiring layers (word lines) 12, and memory cells 10 disposed at portions where the plurality of bit lines 11 intersect the plurality of word lines 12. The configuration of FIG. 4 is an example in which the memory cells 10 are disposed in one layer.

First Comparative Example: One-Layer Memory Cell Configuration

Figure 5A:
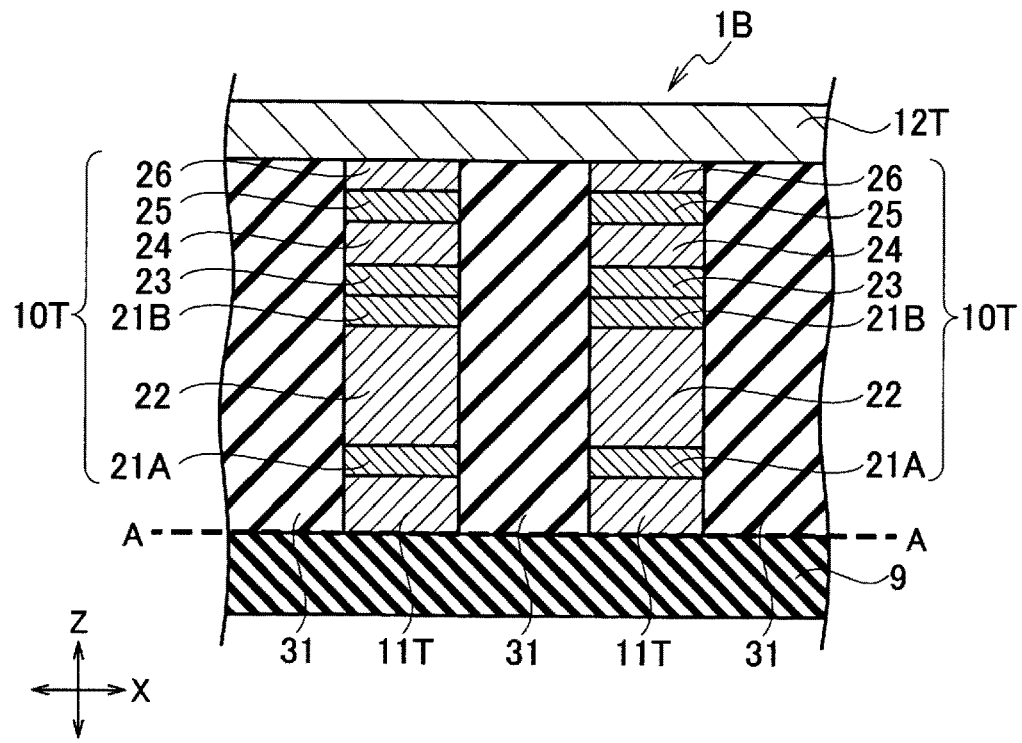
FIG. 5A is a schematic cross-sectional structural view of a nonvolatile semiconductor storage device according to a first comparative example.

As shown in FIG. 5A, a nonvolatile semiconductor storage device 1B according to the first comparative example includes a plurality of first wiring layers 11T, a plurality of second wiring layers 12T, and memory cells 10T, and is disposed, for example, on an insulating substrate 9 including an insulating layer formed on a semiconductor substrate. The plurality of first wiring layers 11T extend in the Y direction perpendicular to a paper surface. The plurality of second wiring layers 12T extend in the X direction intersecting the Y direction above the plurality of first wiring layers 11T. The memory cells 10T are disposed between the second wiring layers 12T and the first wiring layers 11T at portions where the plurality of second wiring layers 12T intersect the plurality of first wiring layers 11T. Interlayer insulating films 31 are provided between the plurality of second wiring layers 12T and the plurality of first wiring layers 11T.

In the nonvolatile semiconductor storage device 1B according to the first comparative example, the stacked films (21A, 22, 21B, 23, 24, 25, 26) are continuously formed on the first wiring layer 11T. That is, as shown in FIG. 5A, the stacked films (21A, 22, 21B, 23, 24, 25, 26) above a dashed line A-A indicating a boundary between the insulating substrate 9 and the plurality of first wiring layers 11T are integrally formed. In the nonvolatile semiconductor storage device 1B according to the first comparative example, since the stacked films (21A, 22, 21B, 23, 24, 25, 26) are continuously formed on the first wiring layer 11T, voids are generated between the first conductive layer 21A and the film forming the selector 22, and thereby the wiring resistance is increased.

Second Comparative Example: One-Layer Memory Cell Configuration

Figure 5B:
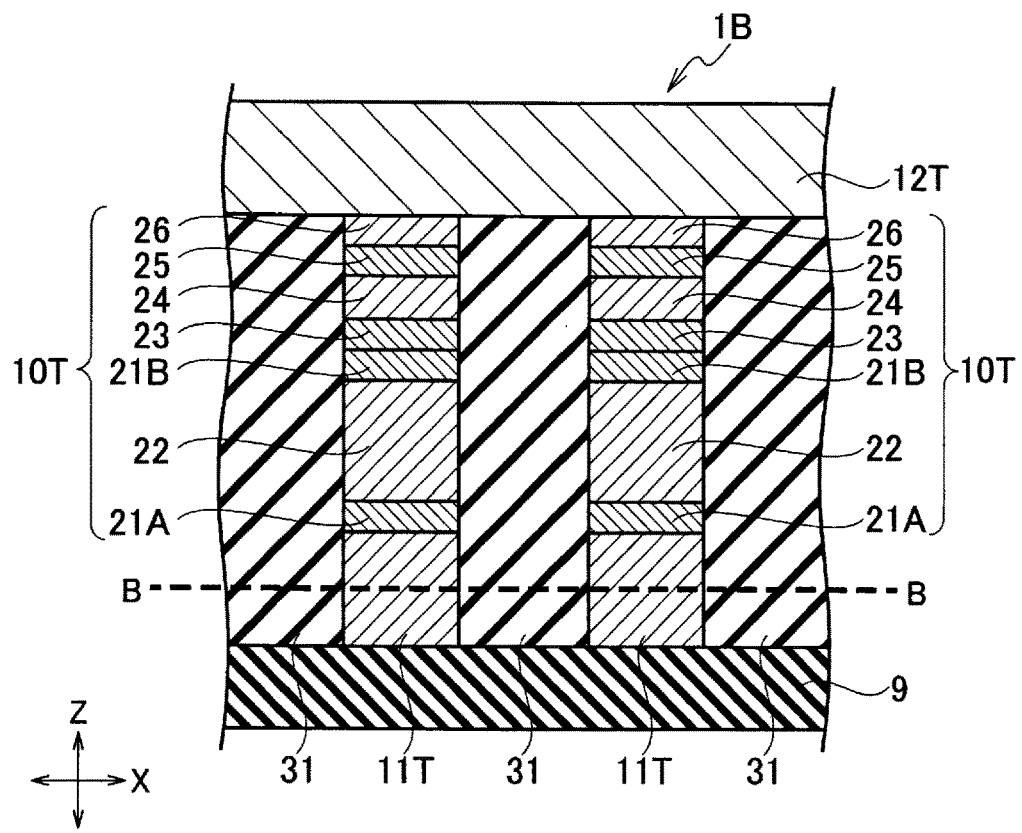
FIG. 5B is a schematic cross-sectional structural view of a nonvolatile semiconductor storage device according to a second comparative example.

The nonvolatile semiconductor storage device 1B according to the second comparative example has similar basic arrangement as that of the first comparative example, but as shown in FIG. 5B, the first wiring layers 11T and the second wiring layers 12T are formed thicker than those in the first comparative example. As shown in FIG. 5B, in order to form the first wiring layers 11T thick, the first wiring layers 11T are formed in two layers. As shown in FIG. 5B, the stacked films (21A, 22, 21B, 23, 24, 25, 26) above a dashed line B-B indicating a boundary of the two-layer first wiring layers 11T are integrally formed. In the nonvolatile semiconductor storage device 1B according to the second comparative example, since the stacked films (21A, 22, 21B, 23, 24, 25, 26) are continuously formed on the first wiring layers 11T, voids are generated between the first conductive layer 21A and the film forming the selector 22, and thereby the wiring resistance is increased.

First Embodiment: One-Layer Memory Cell Configuration

Figure 6A:
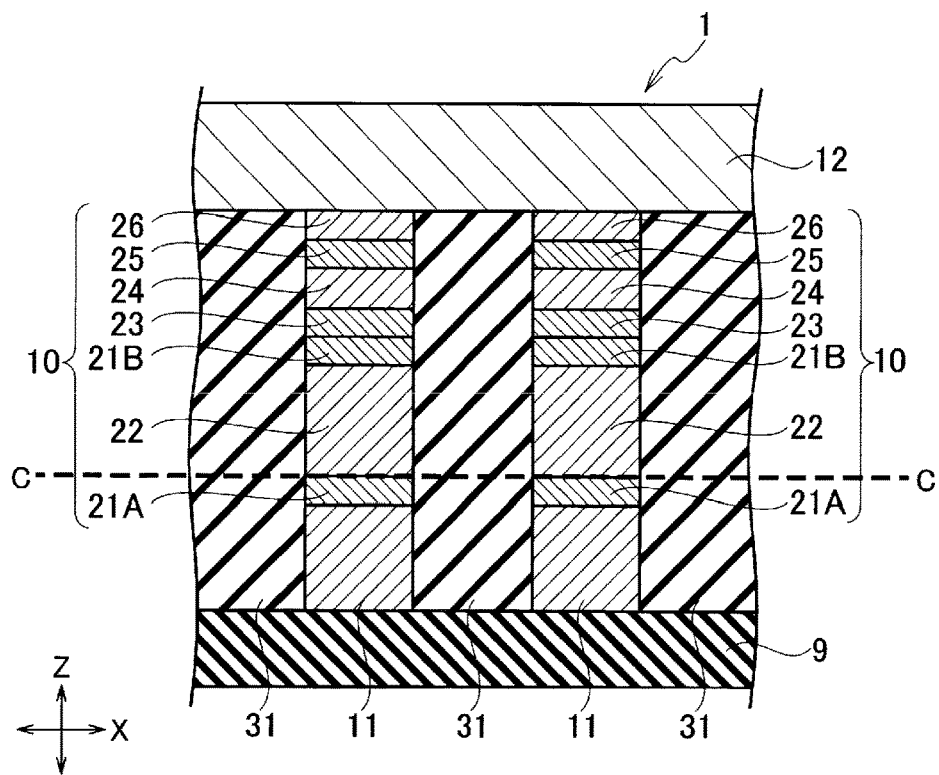
FIG. 6A is a schematic cross-sectional structural view of a nonvolatile semiconductor storage device according to a first embodiment.

As shown in FIG. 6A, the nonvolatile semiconductor storage device 1 according to a first embodiment includes the plurality of first wiring layers 11, first conductive layers 21A, the plurality of second wiring layers 12, and the memory cells 10, and is disposed, for example, on the insulating substrate 9 including an insulating layer formed on a semiconductor substrate.

The plurality of first wiring layers 11 extend in the Y direction.

The first conductive layer 21A is disposed to be self-aligned on the first wiring layer 11 and extends in the Y direction. Here, the word "disposed to be self-aligned" refers to a structure in which the first conductive layer 21A is disposed on the first wiring layer 11 while maintaining a plan shape of the first wiring layer 11. The expression "self-alignment" will be described in the description of a manufacturing method. The same applies below.

The plurality of second wiring layers 12 extend in the X direction intersecting the Y direction above the plurality of first wiring layers 11.

The memory cell 10 includes the stacked films (21A, 22, 21B, 23, 24, 25, 26). The memory cells 10 are disposed between the second wiring layers 12 and the first wiring layers 11 at the portions where the plurality of second wiring layers 12 intersect the plurality of first wiring layers 11. The memory cell 10 includes a cell unit and a selector unit. The cell unit includes the resistance change film 24. The selector unit includes the selector 22 and is connected in series with the cell unit. The selector 22 is connected to the first wiring layer 11 via the first conductive layer 21A. The interlayer insulating film 31 is provided between adjacent memory cells 10. The interlayer insulating film 31 is also disposed between the adjacent first wiring layers 11.

In the nonvolatile semiconductor storage device 1 according to the first embodiment, the first conductive layer 21A is formed on the first wiring layer 11, and after the annealing processing, the stacked films (22, 21B, 23, 24, 25, 26) are integrally stacked. A temperature of the annealing processing is about 200° C. to 300° C.

In the nonvolatile semiconductor storage device 1 according to the first embodiment, after the first conductive layer 21A is formed on the first wiring layer 11, the stacked films (22, 21B, 23, 24, 25, 26) are continuously formed. That is, as shown in FIG. 6A, the stacked films (22, 21B, 23, 24, 25, 26) above a dashed line C-C indicating a boundary between the plurality of conductive layers 21A and the plurality of stacked films (22, 21B, 23, 24, 25, 26) are integrally formed. Since the conductive layer 21A is continuously formed on the first wiring layer 11, the generation of voids between the first conductive layer 21A and the film forming the selector 22 is prevented. That is, when the first wiring layer 11 and the first conductive layer 21A are formed first, the generation of voids between the first conductive layer 21A and the selector 22 can be prevented, and the adhesion between the first wiring layer 11 and the selector 22 can be improved.

In addition, in the nonvolatile semiconductor storage device 1 according to the first embodiment, when the first wiring layer 11 and the first conductive layer 21A are formed first, a height of the first wiring layer 11 can be increased, and the wiring resistance can be reduced.

In FIG. 6A, the interlayer insulating films 31 are disposed between the plurality of first wiring layers 11 and the plurality of second wiring layers 12. As a material of the interlayer insulating film 31, not only $SiO_2$, but also SiO, SiOC, SiON, and the like may be applied.

The first conductive layer 21A contains any material selected from the group consisting of carbon, carbon nitride (CN), titanium nitride (TiN), W, Cu, or Al.

Second Embodiment: One-Layer Memory Cell Configuration

Figure 6B:
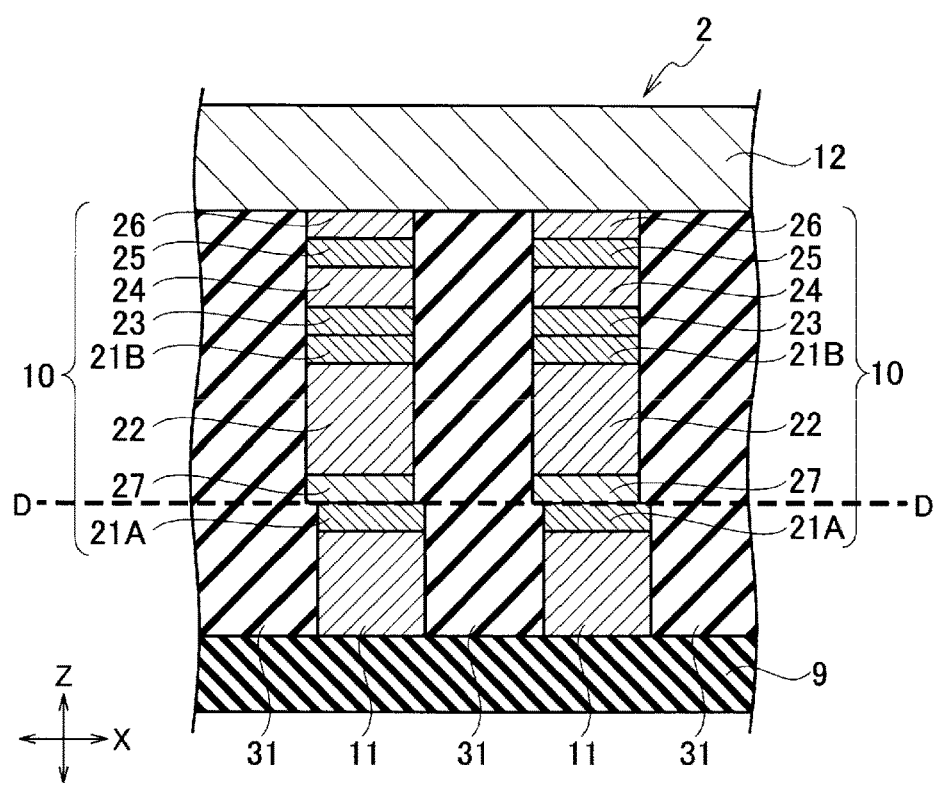
FIG. 6B is a schematic cross-sectional structural view of a nonvolatile semiconductor storage device according to a second embodiment.

As shown in FIG. 6B, a nonvolatile semiconductor storage device 2 according to a second embodiment includes the plurality of first wiring layers 11, the first conductive layers 21A, first barrier conductive layers 27, the plurality of second wiring layers 12, and the memory cells 10.

The first conductive layer 21A is provided on the first wiring layer 11 and extends in the Y direction.

The memory cell 10 includes stacked films (21A, 27, 22, 21B, 23, 24, 25, 26). The memory cells 10 are disposed between the second wiring layers 12 and the first wiring layers 11 at the portions where the plurality of second wiring layers 12 intersect the plurality of first wiring layers 11. The memory cell 10 includes the cell unit and the selector unit. The cell unit includes the resistance change film 24. The selector unit includes the selector 22 and is connected in series with the cell unit. The selector 22 is connected to the first conductive layer 21A via the first barrier conductive layer 27.

The first barrier conductive layer 27 may be formed of any material selected from the group consisting of W, Mo, polysilicon, Ni, Co, Ti, and Cu. Any silicide material containing a material selected from the group consisting of W, Mo, polysilicon, Ni, Co, Ti, and Cu or combinations thereof may be used. In addition, any nitride containing a material selected from the group consisting of W, Mo, polysilicon, Ni, Co, Ti, and Cu or combinations thereof may be used. In addition, a material having any mixing ratio of materials selected from the group consisting of W, Mo, polysilicon, Ni, Co, Ti, and Cu may be used. Other configurations are similar as those in the first embodiment.

In the nonvolatile semiconductor storage device 2 according to the second embodiment, the first conductive layer 21A is formed on the first wiring layer 11, and after the annealing processing, the stacked films (27, 22, 21B, 23, 24, 25, 26) are integrally stacked. The temperature of the annealing processing is about 200° C. to 300° C.

In the nonvolatile semiconductor storage device 2 according to the second embodiment, after the first conductive layer 21A is formed on the first wiring layer 11, the stacked films (27, 22, 21B, 23, 24, 25, 26) are continuously formed. That is, as shown in FIG. 6B, the stacked films (27, 22, 21B, 23, 24, 25, 26) above a dashed line D-D indicating a boundary between the plurality of conductive layers 21A and the plurality of first barrier conductive layers 27 are integrally formed. Since the conductive layer 21A is continuously formed on the first wiring layer 11, the generation of voids between the first conductive layer 21A and the film forming the selector 22 is prevented. That is, when the first wiring layer 11 and the first conductive layer 21A are formed first, the generation of voids between the first conductive layer 21A and the selector 22 can be prevented, and the adhesion between the first wiring layer 11 and the selector 22 can be improved.

In addition, in the nonvolatile semiconductor storage device 2 according to the second embodiment, when the first wiring layer 11 and the first conductive layer 21A are formed first, the height of the first wiring layer 11 can be increased, and the wiring resistance can be reduced.

Further, in the nonvolatile semiconductor storage device 2 according to the second embodiment, the stacked films (27, 22, 21B, 23, 24, 25, 26) can be prevented from being reduced in size by sandwiching the first barrier conductive layer 27 between the first conductive layer 21A and the selector 22. That is, the adhesion between the first conductive layer 21A and the selector 22 can be enhanced by the first barrier conductive layer 27, and a reduction in a cell size can be prevented.

(Wiring Material Selection)

The first wiring layer 11 and the second wiring layer 12 applicable to the nonvolatile semiconductor storage devices according to the first and second embodiments may be formed of any material selected from the group consisting of W, Mo, polysilicon, Ni, Co, Ti, and Cu. Any silicide material containing a material selected from the group consisting of W, Mo, polysilicon, Ni, Co, Ti, and Cu may be used. In addition, any nitride containing a material selected from the group consisting of W, Mo, polysilicon, Ni, Co, Ti, and Cu may be used. In addition, a material having any mixing ratio of materials selected from the group consisting of W, Mo, polysilicon, Ni, Co, Ti, and Cu may be used.

As the silicide material, for example, NiSi, CoSi, WSi, or TiSi may be applied. A mixing ratio of the materials includes, for example, Ni:Si=1:1 or 0.5:1.

(Relationship Between Wiring Resistance and Wiring Width: Mo and W)

Figure 7:
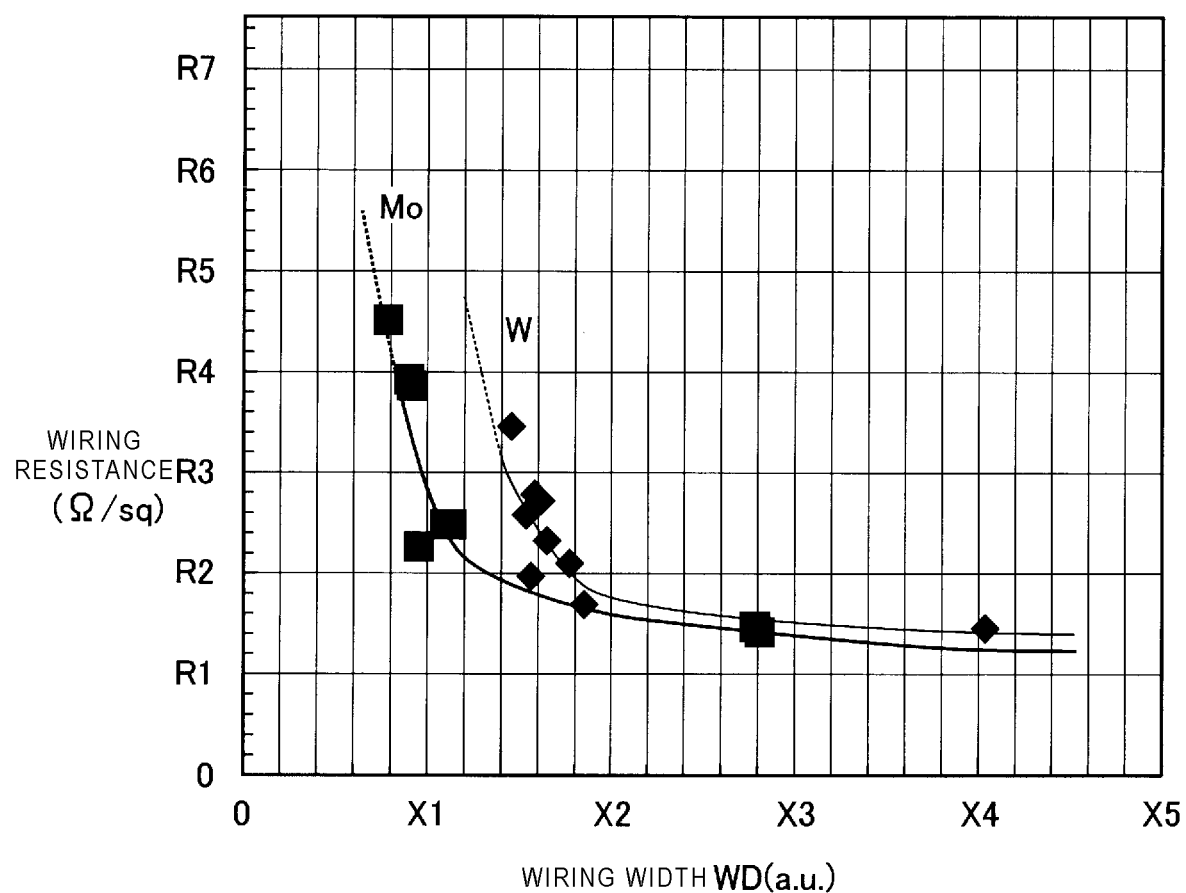
FIG. 7 is a schematic diagram showing a relationship between a wiring resistance ($\Omega$/sq) and a wiring width WD (a.u.) using tungsten and molybdenum as an example of a combination of wiring materials applicable to the nonvolatile semiconductor storage device according to the first embodiment.

FIG. 7 shows a relationship between the wiring resistance (Ω/sq) and a wiring width WD (a.u.) using W and Mo as an example of a combination of wiring materials applicable to the nonvolatile semiconductor storage devices according to the first and second embodiments. When the wiring width WD (a.u.)=X2, a W wiring and a Mo wiring have substantially the same resistance value.

(Etching Gas System)

As an etching gas (etchant) for forming the W wiring by reactive ion etching (RIE), for example, $CF_4/O_2$ may be applied. As an etchant for forming the Mo wiring by RIE, for example, HBr or bromotrifluoromethane ($CBrF_3$) may be applied. With bromotrifluoromethane ($CBrF_3$), it is easier to etch Mo as compared with W. As an etchant for forming the Mo wiring, for example, $CCl_4$ or $SiCl_4/O_2/CHF_3$ may be applied.

Compared with W, as an etchant applicable to Mo etching, a mixed gas of F-based or Cl-based halogen gas and $O_2$ gas may also be applied. The presence of $O_2$ makes it possible to take advantage of the property that Mo is more likely to be oxidized than W, and that oxidation promotes etching. Examples of the mixed gas of F-based or Cl-based halogen gas and $O_2$ gas include $CF_4/O_2$, $CHF_3/O_2$, $CH_2F_2/O_2$, $SF_6/O_2$, or $Cl_2/O_2$.

As an etchant effective for W etching compared with Mo, an F-based gas is also applicable. A metal electrode is mainly processed by chemical etching rather than physical etching. W-F has a lower vapor pressure, and etches better than Mo. By utilizing this property, W can be etched.

According to the nonvolatile semiconductor storage devices according to the first and second embodiments, wiring layers that face the cross point with a one-layer memory cell structure sandwiched therebetween may be formed of different materials. Since a lower wiring layer is difficult to be etched during processing of an upper wiring layer, it is possible to provide a nonvolatile semiconductor storage device in which an increase in the wiring resistance is avoided and the wiring resistance is reduced.

Third Embodiment: Two-Layer Memory Cell Configuration

Figure 8A:
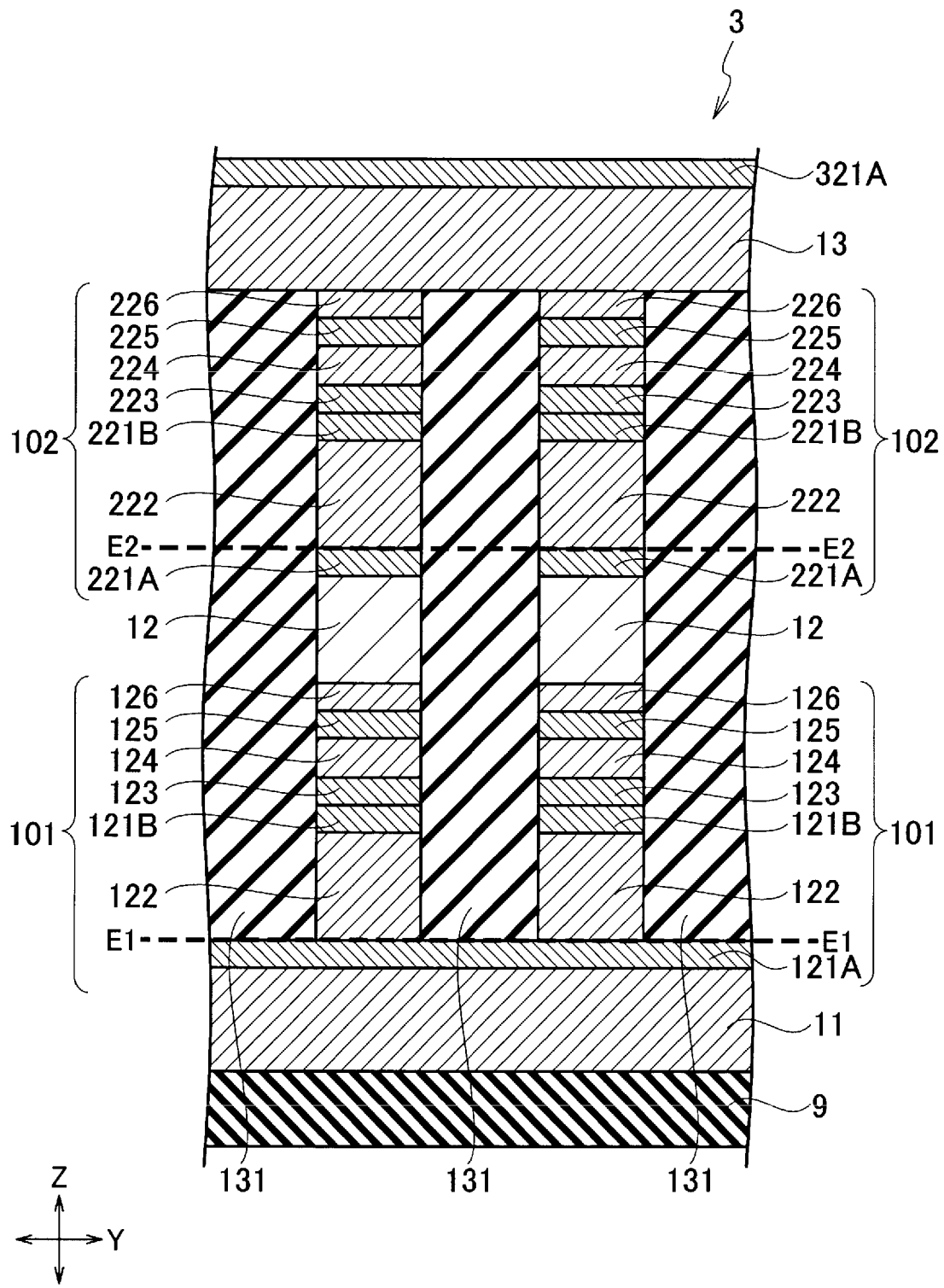
FIG. 8A is a schematic cross-sectional structural view of two-stage components of a memory cell of a nonvolatile semiconductor storage device according to a third embodiment.

A schematic cross-sectional structure of a nonvolatile semiconductor storage device 3 according to a third embodiment is shown in FIG. 8A. FIG. 8A corresponds to a schematic cross-sectional structure viewed from the Y and Z directions. In FIG. 8A, in order to describe a two-layer memory cell structure, the first memory cell 101 and the second memory cell 102 are expressed, but represent the same memory cell 10. Stacked films of the first memory cell 101 is expressed as stacked films (121A, 122, 121B, 123, 124, 125, 126), stacked films of the second memory cell 102 is expressed as stacked films (221A, 222, 221B, 223, 224, 225, 226), but similar to FIG. 2, each layer corresponds to the stacked films (21A, 22, 21B, 23, 24, 25, 26) and has the same stacked film structure. The same applies below.

As shown in FIG. 8A, the nonvolatile semiconductor storage device 3 according to the third embodiment includes the plurality of first wiring layers 11, a first conductive layer 121A, the plurality of second wiring layers 12, and the first memory cells 101, and is disposed, for example, on the insulating substrate 9 including an insulating layer formed on a semiconductor substrate.

The plurality of first wiring layers 11 extend in the Y direction.

The first conductive layer 121A is provided on the first wiring layer 11 and extends in the Y direction.

The plurality of second wiring layers 12 extend in the X direction intersecting the Y direction above the plurality of first wiring layers 11.

The first memory cell 101 includes the stacked films (121A, 122, 121B, 123, 124, 125, 126). The first memory cells 101 are disposed between the second wiring layers 12 and the first wiring layers 11 at the portions where the plurality of second wiring layers 12 intersect the plurality of first wiring layers 11. The first memory cell 101 includes a cell unit and a selector unit. The cell unit includes a resistance change film 124. The selector unit includes a selector 122 and is connected in series with the cell unit. The selector 122 is connected to the first wiring layer 11 via the first conductive layer 121A. An interlayer insulating film 131 is provided between adjacent first memory cells 101. The interlayer insulating film 131 is also disposed between the adjacent first wiring layers 11. The interlayer insulating film 131 is also disposed between the adjacent first wiring layers 12.

Further, as shown in FIG. 8A, the nonvolatile semiconductor storage device 3 according to the third embodiment includes a plurality of third wiring layers 13 and the second memory cells 102. The second memory cell 102 includes the stacked films (221A, 222, 221B, 223, 224, 225, 226). The second memory cells 102 are disposed between the third wiring layers 13 and the second wiring layers 12 at portions where the plurality of third wiring layers 13 intersect the plurality of second wiring layers 12. The second memory cell 102 may include a cell unit and a selector unit (selector region or selection layer). The cell unit includes a resistance change film 224. The selector unit includes a selector 222 and is connected in series with the cell unit. The selector 222 is connected to the second wiring layer 12 via the second conductive layer 221A.

The plurality of third wiring layers 13 extend in the Y direction above the plurality of second wiring layers 12. The interlayer insulating film 131 is also provided between adjacent memory cells 102. The third wiring layer 13 is the same wiring layer as the first wiring layer 11, but is expressed as the third wiring layer 13 for convenience of description.

In the nonvolatile semiconductor storage device 3 according to the third embodiment, the first conductive layer 121A is formed on the first wiring layer 11, and after the annealing processing, the stacked films (122, 121B, 123, 124, 125, 126) are integrally stacked. The temperature of the annealing processing is about 200° C. to 300° C.

In the nonvolatile semiconductor storage device 3 according to the third embodiment, after the first conductive layer 121A is formed on the first wiring layer 11, the stacked films (122, 121B, 123, 124, 125, 126) are continuously formed. That is, as shown in FIG. 8A, the stacked films (122, 121B, 123, 124, 125, 126) above a dashed line E1-E1 indicating a boundary between the plurality of conductive layers 121A and the plurality of stacked films (122, 121B, 123, 124, 125, 126) are integrally formed. Since the conductive layer 121A is continuously formed on the first wiring layer 11, the generation of voids between the first conductive layer 121A and the film forming the selector 122 is prevented. That is, when the first wiring layer 11 and the first conductive layer 121A are formed first, the generation of voids between the first conductive layer 121A and the selector 122 can be prevented, according to at least one embodiment, and the adhesion between the first wiring layer 11 and the selector 122 can be improved.

In addition, in the nonvolatile semiconductor storage device 3 according to the third embodiment, when the first wiring layer 11 and the first conductive layer 21A are formed first, the height of the first wiring layer 11 can be increased, and the wiring resistance can be reduced.

In the nonvolatile semiconductor storage device 3 according to the third embodiment, the second conductive layer 221A is formed on the second wiring layer 12, and after the annealing processing, the stacked films (222, 221B, 223, 224, 225, 226) are integrally stacked. The temperature of the annealing processing is about 200° C. to 300° C.

In the nonvolatile semiconductor storage device 3 according to the third embodiment, after the second conductive layer 221A is formed on the second wiring layer 12, the stacked films (222, 221B, 223, 224, 225, 226) are continuously formed. That is, as shown in FIG. 8A, the stacked films (222, 221B, 223, 224, 225, 226) above a dashed line E2-E2 indicating a boundary between the plurality of conductive layers 221A and the plurality of stacked films (222, 221B, 223, 224, 225, 226) are integrally formed. Since the conductive layer 221A is continuously formed on the second wiring layer 12, the generation of voids between the second conductive layer 221A and the film forming the selector 222 is prevented. That is, when the second wiring layer 12 and the second conductive layer 221A are formed first, the generation of voids between the second conductive layer 221A and the selector 222 can be prevented, and the adhesion between the second wiring layer 12 and the selector 222 can be improved.

In addition, in the nonvolatile semiconductor storage device 3 according to the third embodiment, when the second wiring layer 12 and the second conductive layer 221A are formed first, a height of the second wiring layer 12 can be increased, and the wiring resistance can be reduced.

In the nonvolatile semiconductor storage device 3 according to the third embodiment, a relationship between the third wiring layer 13 and a third conductive layer 321A is also similar.

In FIG. 8A, the interlayer insulating film 131 is disposed between the plurality of first wiring layers 11 and the plurality of second wiring layers 12. The interlayer insulating film 131 is also disposed between the plurality of second wiring layers 12 and the plurality of third wiring layers 13. As a material of the interlayer insulating film 131, not only $SiO_2$, but also SiO, SiOC, SiON, and the like may be applied.

The first conductive layer 121A, the second conductive layer 221A, and the third conductive layer 321A contain any material selected from the group consisting of carbon, carbon nitride (CN), titanium nitride (TiN), W, Cu, or Al.

The first wiring layer 11, the second wiring layer 12, and the third wiring layer 13 may be formed of any material selected from the group consisting of W, Mo, polysilicon, Ni, Co, Ti, and Cu, any silicide material containing a material selected from the above group, any nitride material containing a material selected from the above group, or a material having any mixing ratio of materials selected from the above group.

Modification of Third Embodiment: Two-Layer Memory Cell Configuration

Figure 8B:
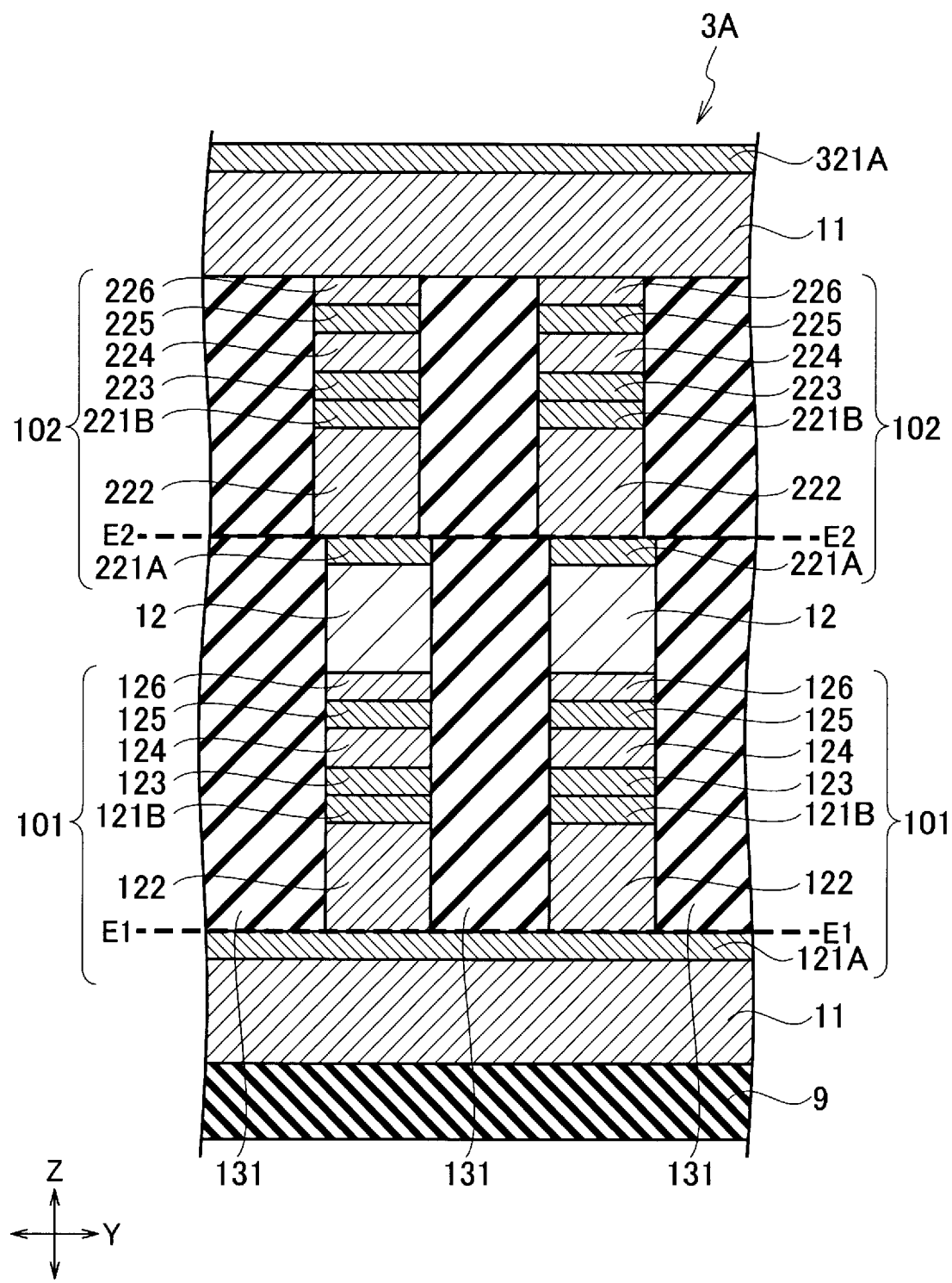
FIG. 8B is a schematic cross-sectional structural view of two-stage components of a memory cell of a nonvolatile semiconductor storage device according to a modification of the third embodiment.

A schematic cross-sectional structure of two-stage components of a memory cell of a nonvolatile semiconductor storage device 3A according to a modification of the third embodiment is shown in FIG. 8B.

In the nonvolatile semiconductor storage device 3A according to the modification of the third embodiment, as shown in FIG. 8B, after the first conductive layers 121A are integrally formed on the first wiring layer 11, the stacked films (122, 121B, 123, 124, 125, 126) above the dashed line E1-E1 are integrally formed.

In the nonvolatile semiconductor storage device 3A according to the modification of the third embodiment, as shown in FIG. 8B, after the second conductive layers 221A are integrally formed on the second wiring layer 12, the stacked films (222, 221B, 223, 224, 225, 226) above the dashed line E2-E2 are integrally formed. In this case, since a mask alignment step is performed, a misalignment may occur in the Y direction at a boundary indicated by the dashed line E2-E2. Similarly, at a boundary indicated by the dashed line E1-E1, a misalignment may occur in the X direction. The nonvolatile semiconductor storage device 3A according to the modification of the third embodiment has the shown configuration. Other configurations are similar as those in the third embodiment.

Also in the nonvolatile semiconductor storage device 3A according to the modification of the third embodiment, when the first wiring layer 11 and the first conductive layer 121A can be formed first, the generation of voids between the first conductive layer 121A and the selector 122 can be prevented, according to at least one embodiment, and the adhesion between the first wiring layer 11 and the selector 122 can be improved. In addition, when the first wiring layer 11 and the first conductive layer 21A are formed first, the height of the first wiring layer 11 can be increased, and the wiring resistance can be reduced.

Also in the nonvolatile semiconductor storage device 3A according to the modification of the third embodiment, when the second wiring layer 12 and the second conductive layer 221A can be formed first, the generation of voids between the second conductive layer 221A and the selector 222 can be prevented, and the adhesion between the second wiring layer 12 and the selector 222 can be improved. In addition, when the second wiring layer 12 and the second conductive layer 221A are formed first, the height of the second wiring layer 12 can be increased, and the wiring resistance can be reduced. Other configurations are similar as those in the third embodiment.

Fourth Embodiment: Two-Layer Memory Cell Configuration

Figure 8C:
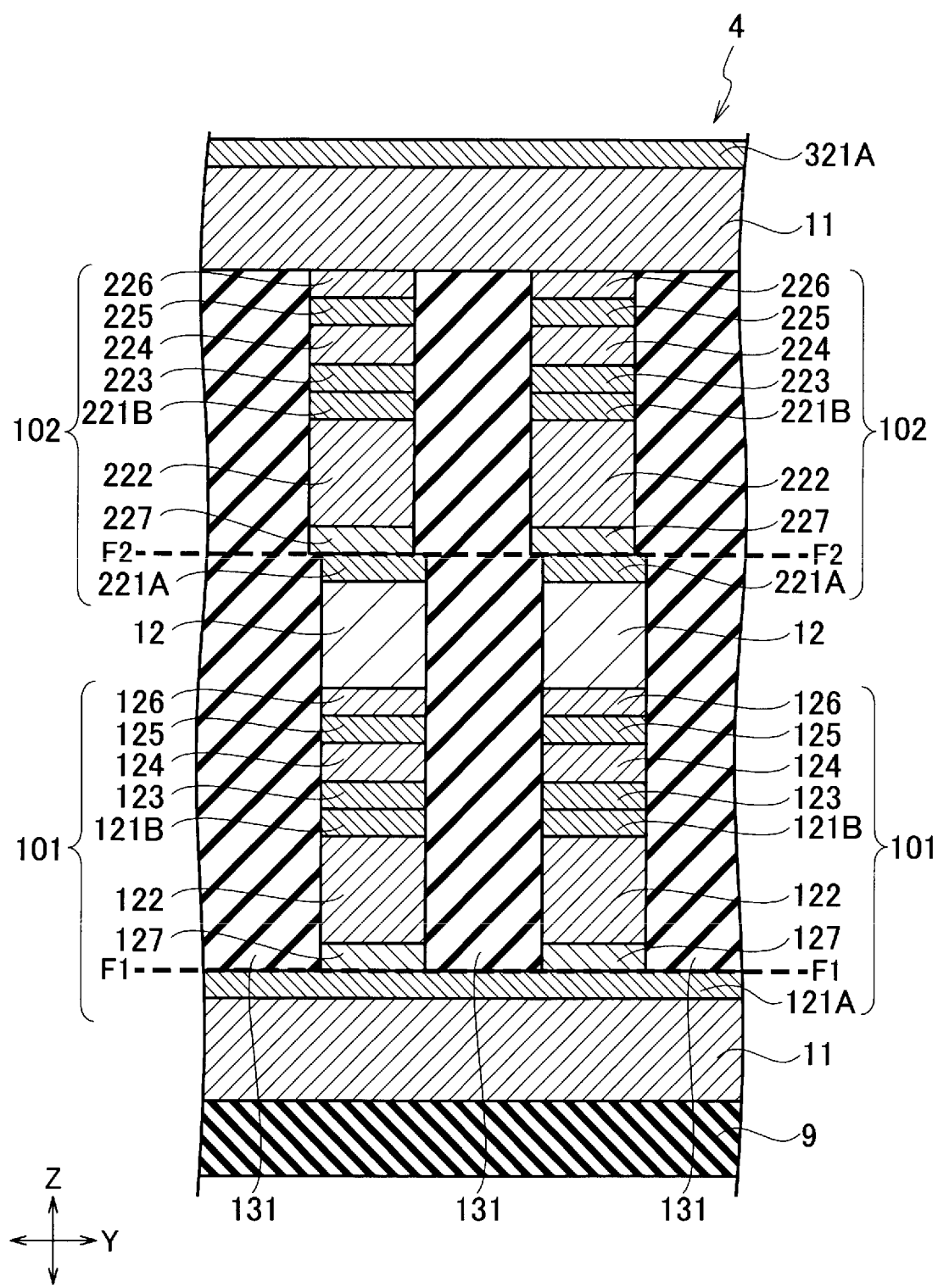
FIG. 8C is a schematic cross-sectional structural view of two-stage components of a memory cell of a nonvolatile semiconductor storage device according to a fourth embodiment.

A schematic cross-sectional structure of two-stage components of a memory cell of a nonvolatile semiconductor storage device 4 according to a fourth embodiment is shown in FIG. 8C.

In the nonvolatile semiconductor storage device 4 according to the fourth embodiment, as shown in FIG. 8C, after the first conductive layers 121A are integrally formed on the first wiring layer 11, stacked films (127, 122, 121B, 123, 124, 125, 126) above a dashed line F1-F1 are integrally formed. The selector 122 is connected to the first conductive layer 121A via the first barrier conductive layer 127.

In the nonvolatile semiconductor storage device 4 according to the fourth embodiment, as shown in FIG. 8C, after the second conductive layers 221A are integrally formed on the second wiring layer 12, stacked films (227, 222, 221B, 223, 224, 225, 226) above a dashed line F2-F2 are integrally formed. The selector 222 is connected to the second conductive layer 221A via the second barrier conductive layer 227.

The first barrier conductive layer 127 and the second barrier conductive layer 227 may be formed of any material selected from the group consisting of W, Mo, polysilicon, Ni, Co, Ti, and Cu. Any silicide material containing a material selected from the group consisting of W, Mo, polysilicon, Ni, Co, Ti, and Cu may be used. In addition, any nitride containing a material selected from the group consisting of W, Mo, polysilicon, Ni, Co, Ti, and Cu may be used. In addition, a material having any mixing ratio of materials selected from the group consisting of W, Mo, polysilicon, Ni, Co, Ti, and Cu may be used.

In the formation of the nonvolatile semiconductor storage device 4 according to the fourth embodiment, since the mask alignment step is performed at a boundary indicated by the dashed line F2-F2, a misalignment may occur in the Y direction. Similarly, at a boundary indicated by the dashed line F1-F1, a misalignment may occur in the X direction. Other configurations are similar as those in the third embodiment.

Also in the nonvolatile semiconductor storage device 4 according to the fourth embodiment, the first wiring layer 11 and the first conductive layer 121A can be formed first to prevent the generation of voids. In addition, the height of the first wiring layer 11 can be increased, and the wiring resistance can be reduced. The second wiring layer 12 and the second conductive layer 221A can be formed first to prevent the generation of voids. In addition, the height of the second wiring layer 12 can be increased, and the wiring resistance can be reduced.

Also in the nonvolatile semiconductor storage device 4 according to the fourth embodiment, adhesion between the first conductive layer 121A and the selector 122 can be enhanced, and the reduction in the cell size can be prevented by sandwiching the first barrier conductive layer 127 between the first conductive layer 121A and the selector 122. Adhesion between the second conductive layer 221A and the selector 222 can be enhanced, and the reduction in the cell size can be prevented by sandwiching the second barrier conductive layer 227 between the second conductive layer 221A and the selector 222.

Fifth Embodiment: Three-Layer Memory Cell Configuration

A nonvolatile semiconductor storage device according to a fifth embodiment has a three-layer memory cell configuration. The nonvolatile semiconductor storage device according to the fifth embodiment has similar configuration as that of the third and fourth embodiments up to the two-layer memory cell configuration.

The nonvolatile semiconductor storage device according to the fifth embodiment includes: the plurality of first wiring layers 11 extending in a first direction; the first conductive layer 121A provided on the first wiring layer 11 and extending in the first direction; the plurality of second wiring layers 12 extending in a second direction intersecting the first direction above the plurality of first wiring layers 11; the first memory cells 101 each including a first cell unit having a first resistance change film 124 and a first selector unit having a first selector 122, and disposed between the second wiring layers 12 and the first wiring layers 11 at portions where the plurality of second wiring layers 12 intersect the plurality of first wiring layers 11; the second conductive layer 221A provided on the second wiring layer 12 and extending in a second direction; the plurality of third wiring layers 13 extending in the first direction above the plurality of second wiring layers 12; and the second memory cells 102 each including a second cell unit having a second resistance change film 224 and a second selector unit having a second selector 222, and disposed between the third wiring layers 13 and the second wiring layers 12 at portions where the plurality of third wiring layers 13 intersect the plurality of second wiring layers 12.

The nonvolatile semiconductor storage device further includes fourth wiring layers provided above the third wiring layers 13 in a third direction perpendicular to the first direction and the second direction and extending in the second direction, and third memory cells each including a third cell unit having a third resistance change film and a third selector unit having a third selector, and disposed between the fourth wiring layers and the third wiring layers 13. Here, a third memory cell $10_3$ (a memory cell in the third layer) will be described with reference to the structure of FIG. 1. As shown in FIG. 1, the third memory cell $10_3$ (the memory cell in the third layer) includes the third cell unit including the third resistance change film and the third selector unit including the third selector, and is disposed between a second wiring layer $12_2$ (the second wiring layer in the second layer) closest to a second wiring layer $12_1$ (the second wiring layer in the first layer) on which the second memory cell $10_2$ (the memory cell in the second layer) is disposed in the Z direction perpendicular to the Y direction and the X direction and a third wiring layer $11_2$ (the first wiring layer in the second layer). Other configurations and effects are similar as those in the third and fourth embodiments.

(Manufacturing Method)
(Mechanism of Void Generation)

The conductive layer 21A formed of carbon is formed on the first wiring layer 11 by sputtering a carbon target using argon ions. At this time, argon is introduced into the conductive layer 21A. When film formation of the selector 22 is performed thereafter, voids considered to be caused by argon are generated at temperatures between 200° C. and 300° C. Therefore, a heat resistance of the selector film is deteriorated, and the limit of a process temperature is increased.

In the nonvolatile semiconductor storage device according to at least one embodiment, after a stack structure of the first wiring layer 11 serving as a lower wiring layer and the conductive layer 21A formed of carbon is formed, degassing of argon is performed by heat treatment between about 200° C. and 300° C. The first wiring layer 11 serving as the lower wiring layer and the conductive layer 21A formed of carbon are formed first, and thus generation of voids is prevented in advance. Then, the selector 22 and the resistance change film 24 are formed to form a memory cell. By forming the conductive layer 21A first, the generation of voids can be prevented. In addition, by forming the conductive layer 21A first, it is possible to increase the height of the first wiring layer 11 serving as the lower wiring layer without changing a height of the memory cell, and it is possible to reduce the wiring resistance for fine wiring.

A basic structure shown in FIG. 1 can be manufactured, for example, as follows. The memory cell 10 including the stacked films is stacked on the first wiring layer 11, and then the stacked films and the first wiring layer 11 are processed into a stripe structure in the Y direction. The interlayer insulating film is embedded in a trench between the stacked films formed by processing, and then the second wiring layer 12 is formed on the stacked films and the interlayer insulating film. By processing the second wiring layer 12 into a stripe structure in the X direction and further processing the stacked films and the interlayer insulating film below and between the second wiring layers 12 processed into the stripe structure, the memory cell 10 formed of a plurality of stacked films having a substantially columnar shape (hereinafter simply referred to as "columnar") can be formed at the portion where the second wiring layer 12 intersect the first wiring layer 11.

(First Manufacturing Method: One-Layer Cell Structure)

A first manufacturing method of the nonvolatile semiconductor storage device 1 according to the first embodiment will be described below with reference to FIGS. 9A to 12.

In the following description, the stacked films (21A, 22, 21B, 23, 24, 25, 26) form the memory cell 10, and thus may be simply referred to as a stacked film 10.

Figure 9A:
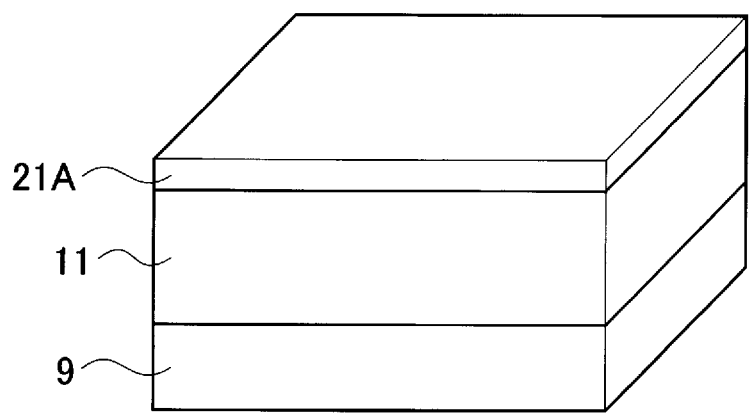
FIG. 9A is a schematic bird's-eye view configuration diagram illustrating a step in a first manufacturing method of the nonvolatile semiconductor storage device according to the first embodiment (part 1).
Figure 9A:
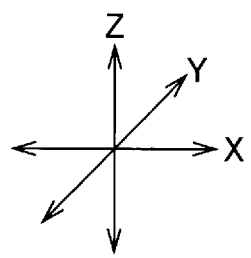
Figure 9B:
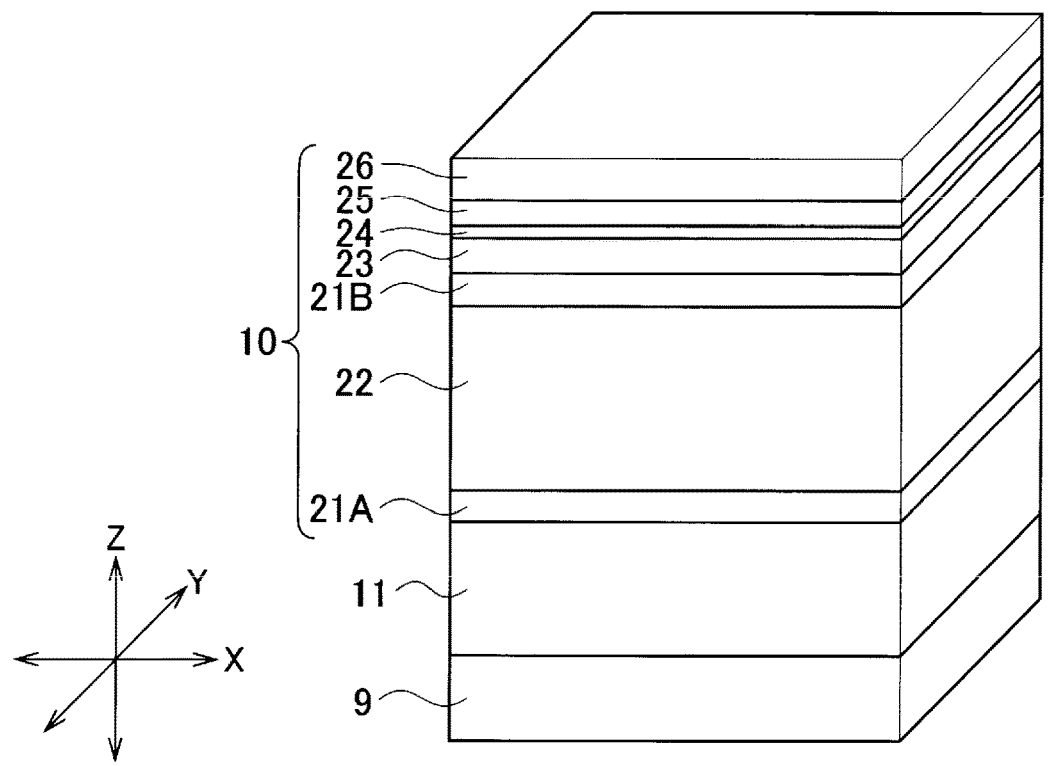
FIG. 9B is a schematic bird's-eye view configuration diagram illustrating a step in the first manufacturing method of the nonvolatile semiconductor storage device according to the first embodiment (part 2).
Figure 9C:
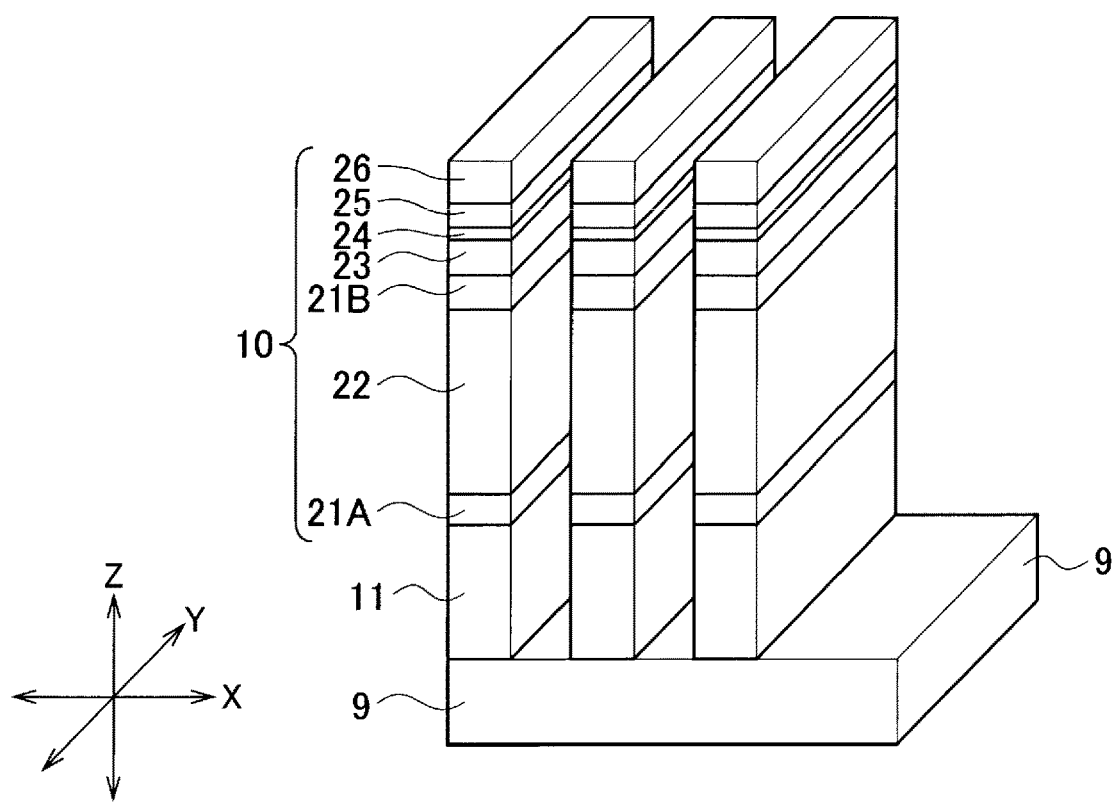
FIG. 9C is a schematic bird's-eye view configuration diagram illustrating a step in the first manufacturing method of the nonvolatile semiconductor storage device according to the first embodiment (part 3).
Figure 10A:
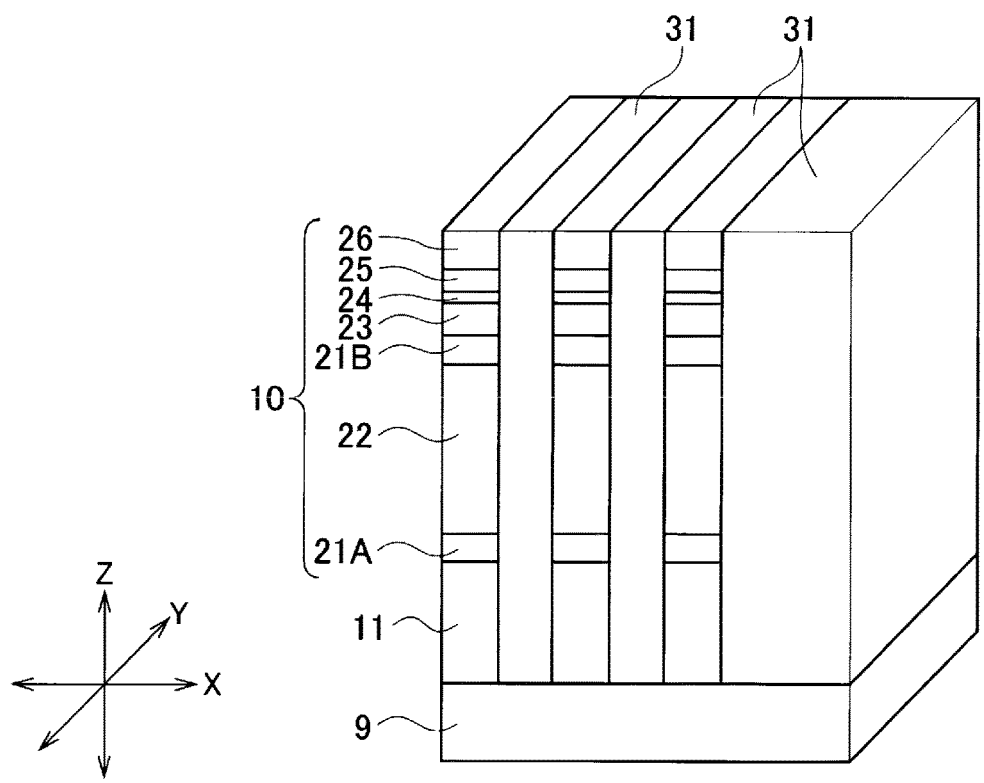
FIG. 10A is a schematic bird's-eye view configuration diagram illustrating a step in the first manufacturing method of the nonvolatile semiconductor storage device according to the first embodiment (part 4).
Figure 10B:
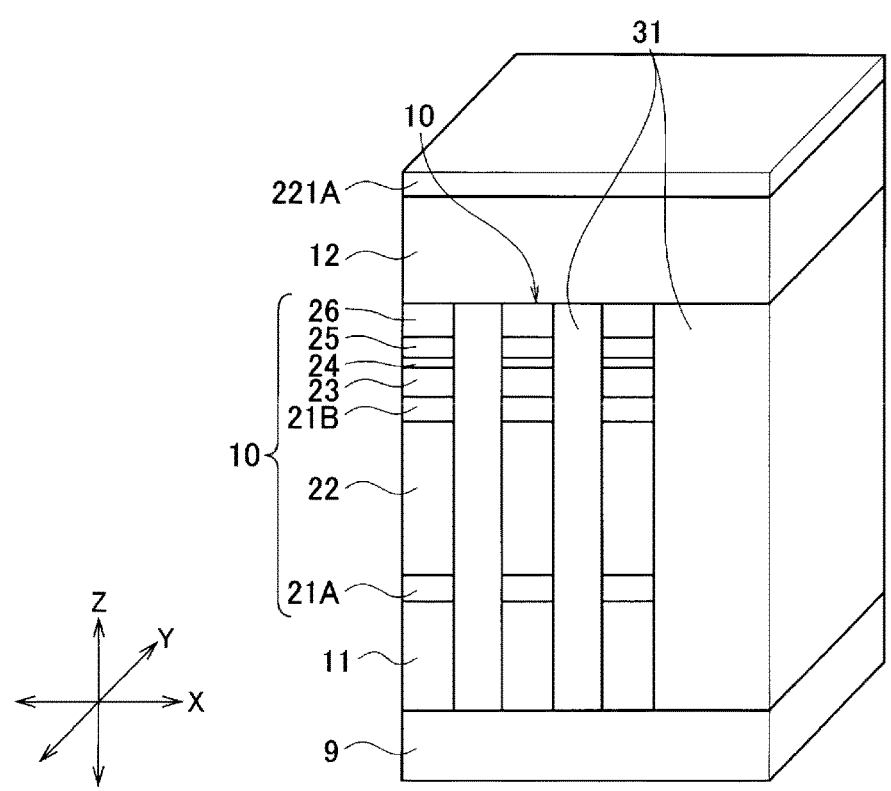
FIG. 10B is a schematic bird's-eye view configuration diagram illustrating a step in the first manufacturing method of the nonvolatile semiconductor storage device according to the first embodiment (part 5).
Figure 11:
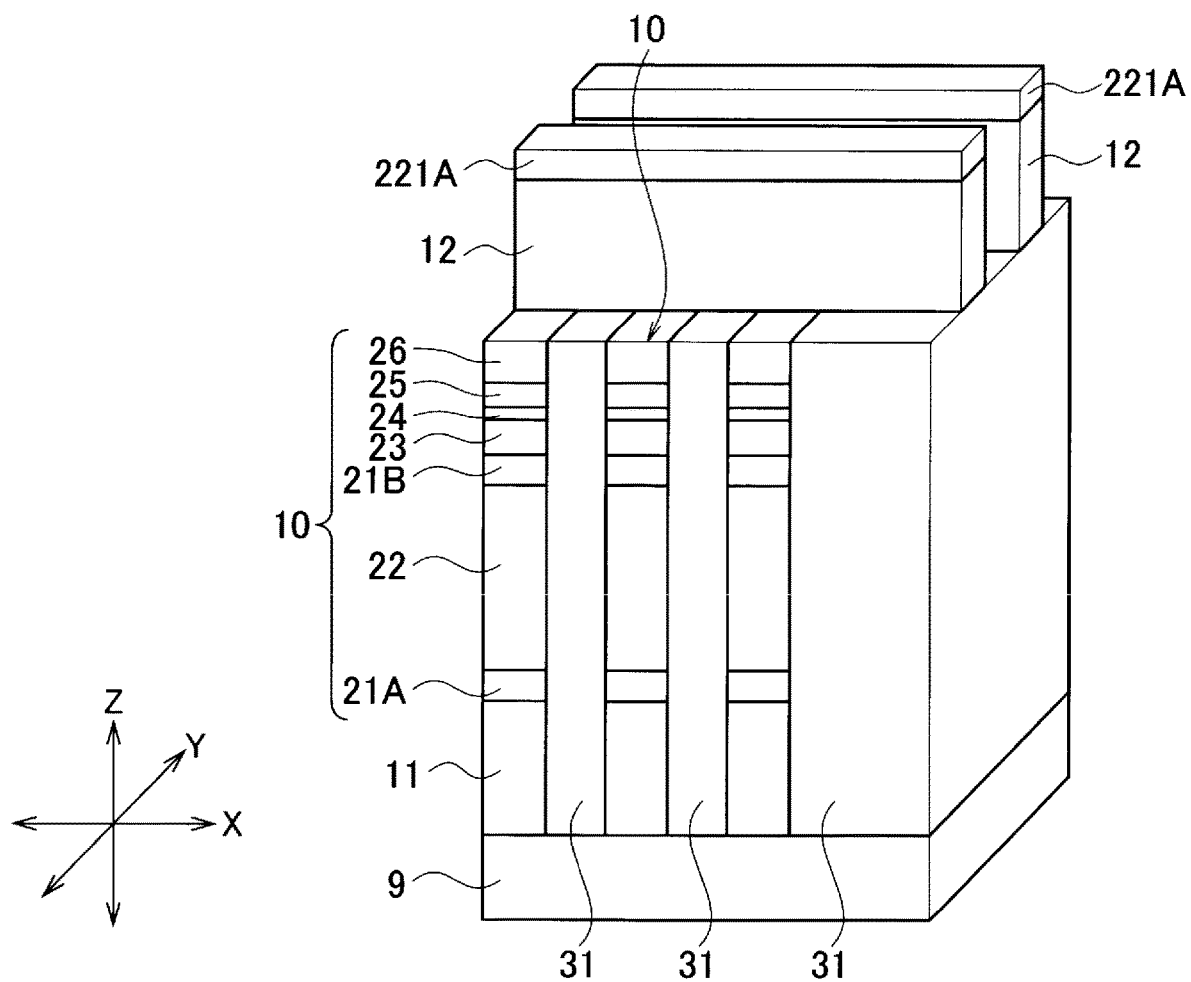
FIG. 11 is a schematic bird's-eye view configuration diagram illustrating a step in the first manufacturing method of the nonvolatile semiconductor storage device according to the first embodiment (part 6).
Figure 12:
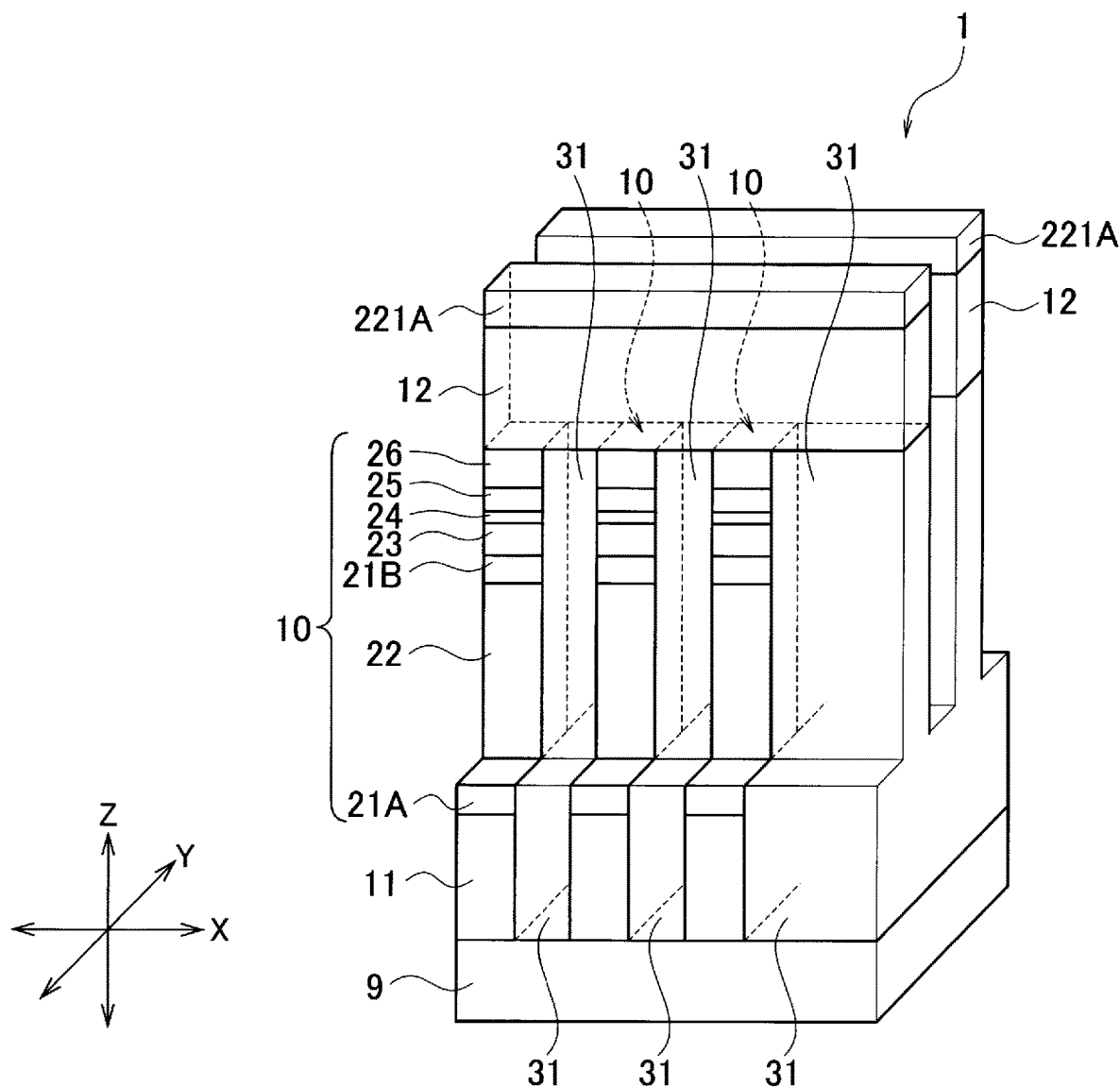
FIG. 12 is a schematic bird's-eye view configuration diagram illustrating a step in the first manufacturing method of the nonvolatile semiconductor storage device according to the first embodiment (part 7).

The first manufacturing method includes the following steps. As shown in FIG. 9A, the first wiring layer 11 and the conductive layer 21A are formed on the insulating substrate 9 and a first annealing processing is performed. Next, as shown in FIG. 9B, the stacked films (22, 21B, 23, 24, 25, 26) are stacked on the conductive layer 21A. Further, as shown in FIG. 9C, the stacked films (22, 21B, 23, 24, 25, 26), the conductive layer 21A, and the first wiring layer 11 are processed to have a stripe structure extending in the Y direction. Next, as shown in FIG. 10A, the interlayer insulating film 31 is formed and planarized. Next, as shown in FIG. 10B, the second wiring layer 12 and the conductive layer 221A are formed, and an annealing processing is performed. Next, as shown in FIG. 11, the second wiring layer 12 and the conductive layer 221A are processed into a stripe structure extending in the X direction, and the second wiring layer 12 and the conductive layer 221A overlapping the stacked film 10 are formed. Next, as shown in FIG. 12, the stacked film 10 and the interlayer insulating film 31 below and between the second wiring layers 12 are processed, and the memory cell 10 having the stacked film in a columnar shape is formed. Details are given below.

a) First, as shown in FIG. 9A, the first wiring layer 11 is formed on the insulating substrate 9, then the conductive layer 21A is formed on the first wiring layer 11, and an annealing processing is performed. The temperature of the annealing processing is in a range of 200° C. to 300° C. The conductive layer 21A may be formed by self-alignment on the first wiring layer 11.

(b) Next, as shown in FIG. 9B, the stacked films (22, 21B, 23, 24, 25, 26) are stacked on the conductive layer 21A. That is, the selector 22, the conductive film 21B, the conductive film 23, the resistance change film 24, the conductive film 25, and the electrode layer 26 are sequentially formed on the conductive layer 21A on the first wiring layer 11.

(c) Next, as shown in FIG. 9C, the stacked films (22, 21B, 23, 24, 25, 26), the conductive layer 21A, and the first wiring layer 11 are simultaneously processed into a stripe structure extending in the Y direction by, for example, a reactive ion etching (RIE) method. The plurality of first wiring layers 11, the conductive layers 21A, and the stacked films (22, 21B, 23, 24, 25, 26) sandwiches the trench in the X direction orthogonal to the Y direction.

(d) Next, as shown in FIG. 10A, the interlayer insulating film 31 is formed, and planarized by using a chemical mechanical polishing (CMP) technique or the like. As a result, the interlayer insulating film 31 is embedded in the trench formed by the processing.

The interlayer insulating film 31 is provided in a region between adjacent first wiring layers 11 in the X direction, a region between adjacent conductive layers 21A in the X direction, and a region between adjacent stacked films (22, 21B, 23, 24, 25, 26) in the X direction. The interlayer insulating film 31 may be embedded via a liner film (not shown). The liner film is conformally formed before the interlayer insulating film 31 is formed.

As the interlayer insulating film 31, for example, a silicon oxide film or a silicon nitride film is formed by an atomic layer deposition (ALD) method, a low-pressure chemical vapor deposition (CVD) method, or a flowable CVD method.

The flowable CVD method is a type of plasma CVD method and forms a $SiO_xN_xH_x$ film having flowability similar to that of a liquid by mixing impurities at a temperature of about 400° C., for example. Thereafter, for example, by baking in an $O_3$ atmosphere of about 200° C., or by performing a water vapor gas treatment at a temperature of about 350° C., $NH_3$ (gas) is removed from the $SiO_xN_xH_x$ film to form SiO (silicon oxide film).

For example, the first conductive layer 21A contains any material selected from the group consisting of carbon, carbon nitride (CN), titanium nitride (TiN), W, Cu, or Al. The conductive film 21B may be formed of a carbon-based conductive film, and the conductive films 23 and 25 may be formed of WN. For example, the first wiring layer 11 may be formed of Mo or W, the electrode layer 26 may be formed of W, and the interlayer insulating film 31 may be formed of a silicon oxide film. The interlayer insulating film 31 may be multilayered. At least two or more electrode layers may be stacked on the first wiring layer 11 and the second wiring layer 12.

The interlayer insulating film 31 may include, for example, a silicon oxide film formed by a plasma chemical vapor deposition (CVD) method, a low-pressure CVD method, an ALD method, or a coating method using a source gas containing tetraethyl orthosilicate, tetraethoxysilane (TEOS).

The interlayer insulating film 31 may be a film including different types of films, for example, a multilayer film including a silicon oxide film and a silicon nitride film. The interlayer insulating film 31 may be a multilayer film including the same type of film, for example, silicon oxide. In addition, a multilayer film including the same type of film but having different film qualities may be used.

For example, the silicon oxide film may contain hydrogen (H) due to the source gas. An amount of a Si—H bond in the silicon oxide film can be controlled by a film forming method and film forming conditions. In general, a dense silicon oxide film tends to have a smaller amount of the Si—H bond. Therefore, when a silicon oxide film is used as the interlayer insulating film 31, by controlling the amount of the Si-H bond in the interlayer insulating film to form a dense film, for example, an etching rate can be controlled for RIE using gas containing fluorocarbon (for example, $C_4F_8$, $C_4F_6$, and $CF_4$).

By, for example, a CMP method, the interlayer insulating film 31 deposited above the stacked film 10 is polished and removed and an upper surface of the interlayer insulating film 31 is planarized. As shown in FIG. 10A, an upper surface of the electrode layer 26 is exposed.

(e) Next, as shown in FIG. 10B, the second wiring layer 12 is formed on the electrode layer 26 and the interlayer insulating film 31, then the conductive layer 221A is formed on the second wiring layer 12, and an annealing processing is performed. The temperature of the annealing processing is in a range of 200° C. to 300° C., for example. Here, the second wiring layer 12 may be formed of a material different from that of the first wiring layer 11. For example, the first wiring layer 11 may be formed of Mo and the second wiring layer 12 may be formed of W.

(f) Next, as shown in FIG. 11, the second wiring layer 12 and the conductive layer 221A are processed into a stripe structure extending in the X direction. As a result, the second wiring layer 12 is connected to the electrode layer 26 of the memory cell 10.

The plurality of second wiring layers 12 and the conductive layers 221A are disposed in the Y direction with a gap therebetween, and an upper surface of the stacked film 10 (the upper surface of the electrode layer 26) and the upper surface of the interlayer insulating film 31 are exposed between the second wiring layers 12 adjacent in the Y direction. The second wiring layer 12 and the conductive layer 221A extend in the X direction and further extend beyond sides of the stacked film 10.

(g) Next, as shown in FIG. 12, the stacked film 10 and the interlayer insulating film 31 below and between the second wiring layer 12 and the conductive layer 221A processed into the stripe structure are also processed by an RIE method using a mask (not shown) to form, at the portion where the second wiring layer 12 intersects the first wiring layer 11, the first memory cell having the stacked film 10 in a columnar shape.

Here, for the etching of the stacked film 10 or the interlayer insulating film 31 below and between the second wiring layer 12 and the conductive layer 221A, for example, an RIE method using gas containing fluorocarbon (for example, $C_4F_8$, $C_4F_6$, and $CF_4$) may be used. The stacked film 10 and the interlayer insulating film 31 below and between the second wiring layer 12 and the conductive layer 221A are simultaneously etched and removed.

(Second Manufacturing Method: One-Layer Cell Structure)

A second manufacturing method of the nonvolatile semiconductor storage device 1 according to the first embodiment will be described below with reference to FIGS. 13A to 16B.

Figure 13A:
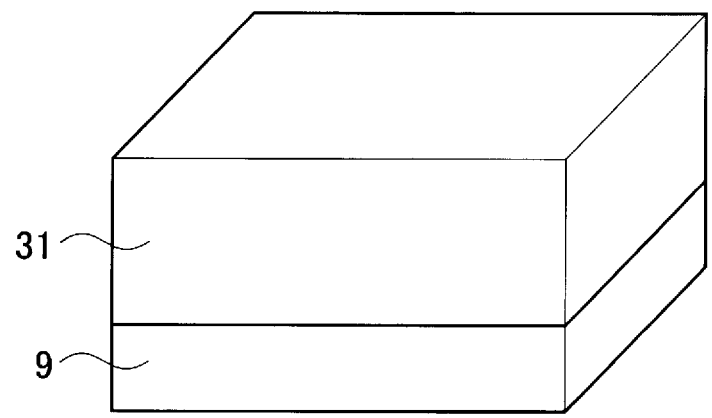
FIG. 13A is a schematic bird's-eye view configuration diagram illustrating a step in a second manufacturing method of the nonvolatile semiconductor storage device according to the first embodiment (part 1).
Figure 13B:
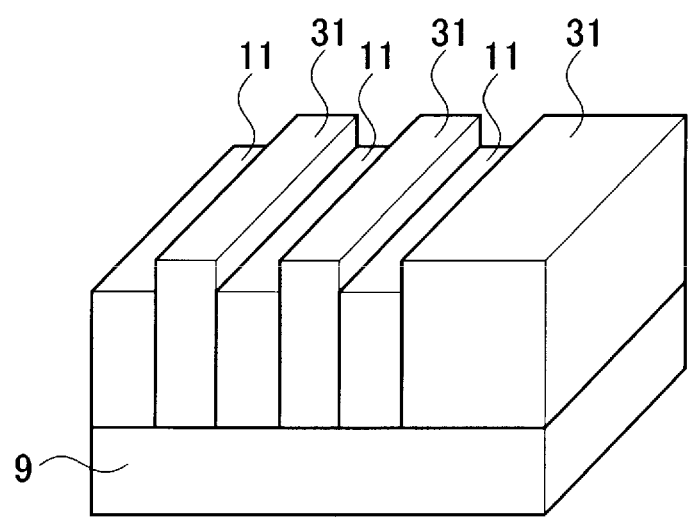
FIG. 13B is a schematic bird's-eye view configuration diagram illustrating a step in the second manufacturing method of the nonvolatile semiconductor storage device according to the first embodiment (part 2).
Figure 15:
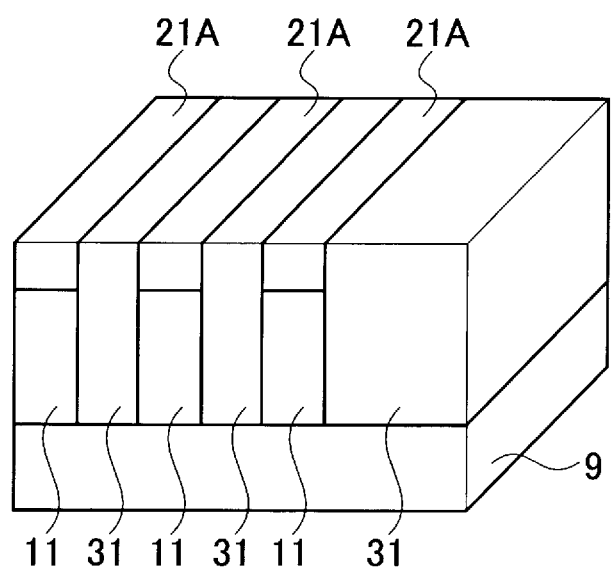
FIG. 15 is a schematic bird's-eye view configuration diagram illustrating a step in the second manufacturing method of the nonvolatile semiconductor storage device according to the first embodiment (part 3).
Figure 16A:
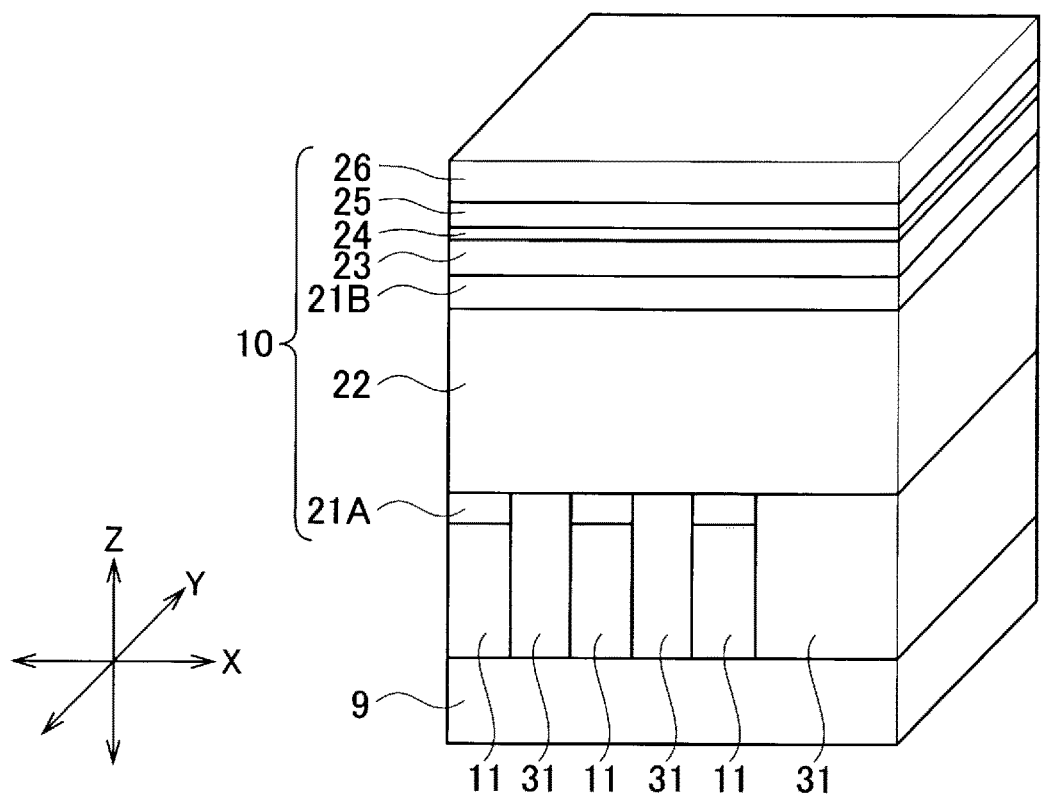
FIG. 16A is a schematic bird's-eye view configuration diagram illustrating a step in the second manufacturing method of the nonvolatile semiconductor storage device according to the first embodiment (part 4).
Figure 16B:
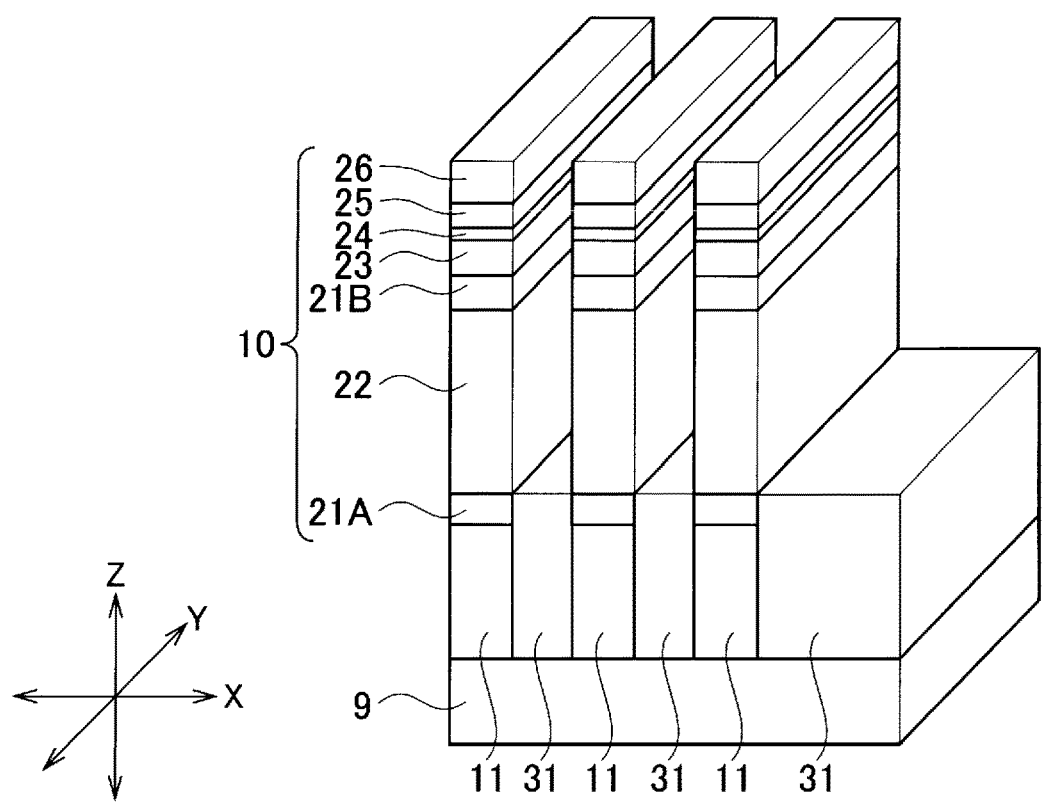
FIG. 16B is a schematic bird's-eye view configuration diagram illustrating a step in the second manufacturing method of the nonvolatile semiconductor storage device according to the first embodiment (part 5).

The second manufacturing method includes the following steps. As shown in FIG. 13A, the first interlayer insulating film 31 is formed and planarized on the insulating substrate 9. Next, as shown in FIG. 13B, the first interlayer insulating film 31 is patterned with a predetermined pitch in the Y direction, and then the first wiring layer 11 is embedded in a trench groove between the patterned first interlayer insulating films 31. Next, as shown in FIG. 15, the conductive layer 21A is formed on the first wiring layer 11, an annealing processing is performed, and planarization is performed by CMP or the like. Next, as shown in FIG. 16A, the stacked films (22, 21B, 23, 24, 25, 26) are formed on the conductive layer 21A and the interlayer insulating film 31. Next, as shown in FIG. 16B, the stacked films (22, 21B, 23, 24, 25, 26) are processed into a stripe structure extending in the Y direction. Next, similar to FIG. 10A, the second interlayer insulating film 31 is formed and planarized. Next, similar to FIG. 10B, the second wiring layer 12 and the conductive layer 221A are formed, and an annealing processing is performed. Next, similar to FIG. 11, the second wiring layer 12 and the conductive layer 221A are processed into a stripe structure extending in the X direction, and the second wiring layer 12 overlapping the stacked films (22, 21B, 23, 24, 25, 26) are formed. Next, similar to FIG. 12, the stacked films (22, 21B, 23, 24, 25, 26) and the interlayer insulating film 31 below and between the second wiring layers 12 and the conductive layer 221A are processed, and the memory cell 10 including the stacked films (22, 21B, 23, 24, 25, 26) in a columnar shape is formed. Details are given below.

(a) First, as shown in FIG. 13A, the interlayer insulating film 31 is formed on the insulating substrate 9 and planarized by using a CMP technique or the like.

(b) Next, as shown in FIG. 13B, the interlayer insulating film 31 is patterned at a predetermined pitch in the X direction, and the first wiring layer 11 is formed in the trench groove between the patterned interlayer insulating films 31.

(c) Next, as shown in FIG. 15, the conductive layer 21A is formed on the first wiring layer 11, and an annealing processing is performed. The temperature of the annealing processing is in a range of 200° C. to 300° C. Thereafter, planarization is performed by CMP or the like. The conductive layer 21A may be formed by self-alignment on the first wiring layer 11.

Figure 14A:
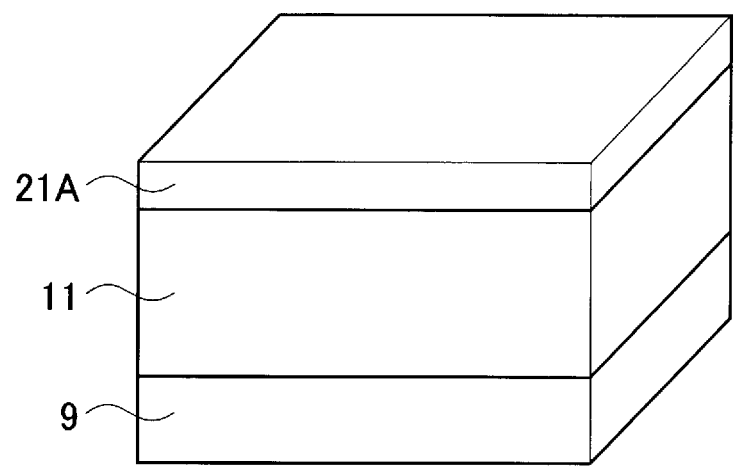
FIG. 14A is a schematic bird's-eye view configuration diagram illustrating a step in a modification of the second manufacturing method of the nonvolatile semiconductor storage device according to the first embodiment (part 1).

(a1) In a modification of the second manufacturing method, the first wiring layer 11 and the conductive layer 21A are formed on the insulating substrate 9 as shown in FIG. 14A, and an annealing processing is performed. The temperature of the annealing processing is in a range of 200° C. to 300° C.

Figure 14B:
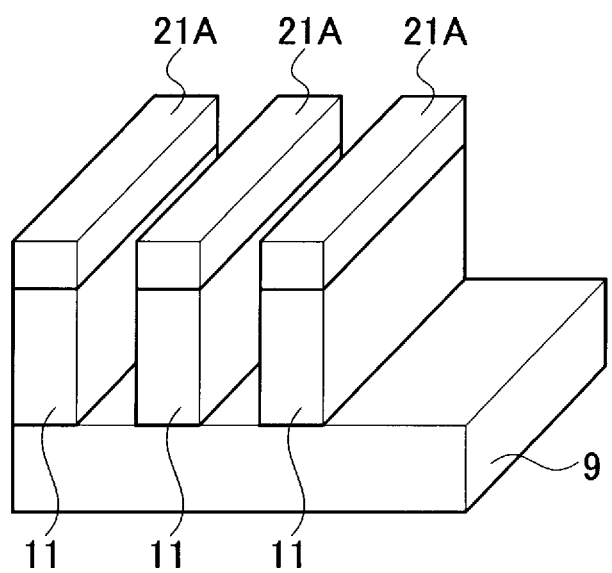
FIG. 14B is a schematic bird's-eye view configuration diagram illustrating a step in the modification of the second manufacturing method of the nonvolatile semiconductor storage device according to the first embodiment (part 2).

(b1) Next, as shown in FIG. 14B, the first wiring layer 11 and the conductive layer 21A are patterned.

(c1) Next, similar to FIG. 15, the interlayer insulating film 31 is formed in the trench groove between the first wiring layer 11 and the conductive layer 21A, and planarized by CMP or the like.

(d) Next, as shown in FIG. 16A, the stacked films (22, 21B, 23, 24, 25, 26) are formed on the conductive layer 21A and the interlayer insulating film 31. That is, the selector 22, the conductive film 21B, the conductive film 23, the resistance change film 24, the conductive film 25, and the electrode layer 26 are sequentially formed on the conductive layer 21A and the interlayer insulating film 31.

(e) Next, as shown in FIG. 16B, the stacked films (22, 21B, 23, 24, 25, 26) are processed by, for example, an RIE method. As shown in FIG. 16B, the stacked films (22, 21B, 23, 24, 25, 26) on the first wiring layer 11 and the conductive layer 21A are processed into a stripe structure extending in the Y direction.

The steps thereafter are similar to those of the first manufacturing method. That is, the nonvolatile semiconductor storage device 1 according to the first embodiment is formed by the steps shown in FIGS. 10A to 12.

(Third Manufacturing Method: One-Layer Cell Structure)

A third manufacturing method of the nonvolatile semiconductor storage device 1 according to the first embodiment will be described below with reference to FIG. 17.

The third manufacturing method includes the following steps. As shown in FIG. 13A, the first interlayer insulating film 31 are formed and planarized on the insulating substrate 9. Next, as shown in FIG. 13B, the first interlayer insulating film 31 is patterned with a predetermined pitch in the Y direction, and then the first wiring layer 11 is embedded in the trench groove between the patterned first interlayer insulating films 31. Next, as shown in FIG. 15, the conductive layer 21A is formed on the first wiring layer 11, a first annealing processing is performed, and the planarization is performed by CMP or the like.

A modification of the third manufacturing method includes the following steps. As shown in FIG. 14A, the first wiring layer 11 and the conductive layer 21A are formed on the insulating substrate 9 and a first annealing processing is performed. Next, as shown in FIG. 14B, the first wiring layer 11 and the first conductive layer 21A are patterned. Next, similar to FIG. 15, the first interlayer insulating film 31 is formed in the trench groove between the first wiring layer 11 and the first conductive layer 21A, and planarized by CMP or the like.

Next, as shown in FIG. 16A, the stacked films (22, 21B, 23, 24, 25, 26) are formed on the conductive layer 21A and the interlayer insulating film 31. Next, as shown in FIG. 16B, the stacked films (22, 21B, 23, 24, 25, 26) on the conductive layer 21A are processed into a stripe structure extending in the Y direction. Next, similar to FIG. 10A, the second interlayer insulating film 31 is formed and planarized. Next, as shown in FIG. 17, the stacked films (22, 21B, 23, 24, 25, 26) on the first conductive layer 21A are processed in the X direction intersecting the Y direction, and the stacked films (22, 21B, 23, 24, 25, 26) having a columnar shape are formed. Next, a third interlayer insulating film is formed and planarized. Next, similar to FIG. 10B, the second wiring layer 12 and the conductive layer 221A are formed, and a second annealing processing is performed. Next, similar to FIG. 11, the second wiring layer 12 and the conductive layer 221A are processed into a stripe structure extending in the X direction, and the second wiring layer 12 overlapping the stacked films (22, 21B, 23, 24, 25, 26) is formed. Details are given below.

(a) First, as shown in FIG. 13A, the interlayer insulating film 31 is formed on the insulating substrate 9 and planarized by using a CMP technique or the like.

(b) Next, as shown in FIG. 13B, the interlayer insulating film 31 is patterned at a predetermined pitch in the X direction, and the first wiring layer 11 is formed in the trench groove between the patterned interlayer insulating films 31.

(c) Next, as shown in FIG. 15, the first conductive layer 21A is formed on the first wiring layer 11, and a first annealing processing is performed. A temperature of the first annealing processing is in a range of 200° C. to 300° C. Thereafter, planarization is performed by CMP or the like. The conductive layer 21A may be formed by self-alignment on the first wiring layer 11.

(a1) In the modification of the third manufacturing method, the first wiring layer 11 and the conductive layer 21A are formed on the insulating substrate 9 as shown in FIG. 14A, and a first annealing processing is performed. The temperature of the first annealing processing may be in a range of 200° C. to 300° C.

(b1) Next, as shown in FIG. 14B, the first wiring layer 11 and the conductive layer 21A are patterned.

(c1) Next, similar to FIG. 15, the first interlayer insulating film 31 is formed in the trench groove between the first wiring layer 11 and the conductive layer 21A, and planarized by the CMP or the like.

(d) Next, as shown in FIG. 16A, the stacked films (22, 21B, 23, 24, 25, 26) are formed on the conductive layer 21A and the interlayer insulating film 31. That is, the selector 22, the conductive film 21B, the conductive film 23, the resistance change film 24, the conductive film 25, and the electrode layer 26 are sequentially formed on the conductive layer 21A and the interlayer insulating film 31.

(e) Next, as shown in FIG. 16B, the stacked films (22, 21B, 23, 24, 25, 26) and the interlayer insulating film 31 are processed by, for example, an RIE method. As shown in FIG. 16B, the stacked films (22, 21B, 23, 24, 25, 26) on the conductive layer 21A are processed into a stripe structure extending in the Y direction.

(f) Next, as shown in FIG. 10A, the interlayer insulating film 31 is formed, and is planarized by using a CMP technique or the like. As a result, the interlayer insulating film 31 is embedded in the trench between the stacked films (22, 21B, 23, 24, 25, 26) formed by the processing.

Figure 17:
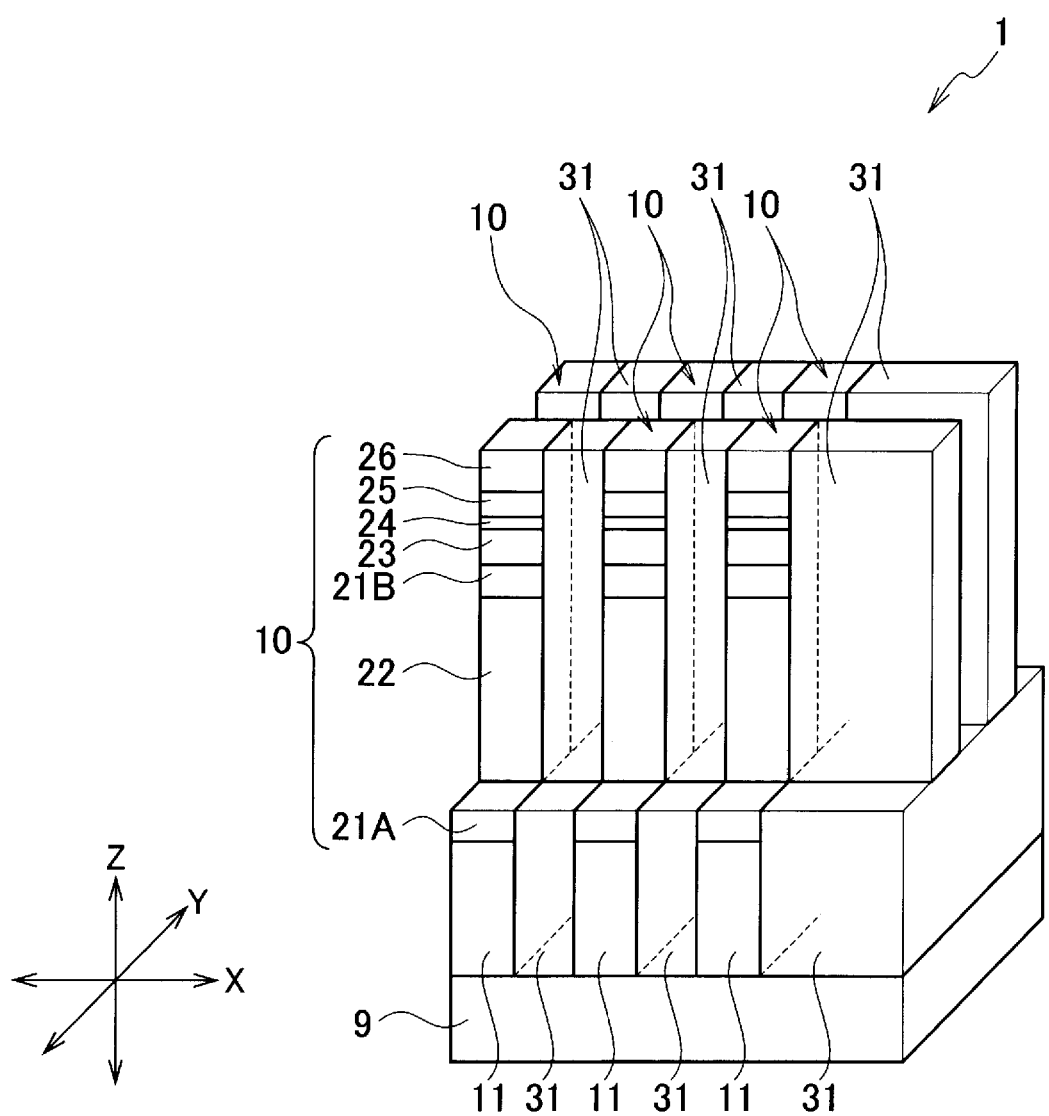
FIG. 17 is a schematic bird's-eye view configuration diagram illustrating a step in a third manufacturing method of the nonvolatile semiconductor storage device according to the first embodiment.

(g) Next, as shown in FIG. 17, the stacked films (22, 21B, 23, 24, 25, 26) on the first conductive layer 21A are processed in the X direction intersecting the Y direction, and the memory cell including the stacked films (22, 21B, 23, 24, 25, 26) in a columnar shape is formed.

(h) Next, the interlayer insulating film 31 is formed, and is planarized by using a CMP technique or the like. As a result, the interlayer insulating film 31 is embedded in the trench between the columnar stacked films (22, 21B, 23, 24, 25, 26) formed by the processing.

(i) Next, similar to FIG. 10B, the second wiring layer 12 and the conductive layer 221A are formed and a second annealing processing is performed. A temperature of the second annealing processing may be in a range of 200° C. to 300° C.

(j) Next, similar to FIG. 11, the second wiring layer 12 and the conductive layer 221A are processed into a stripe structure extending in the X direction. As a result, the second wiring layer 12 is connected to the electrode layer 26 of the memory cell 10.

The steps thereafter are similar to those of the first manufacturing method. That is, the nonvolatile semiconductor storage device 1 according to the first embodiment is formed by the steps shown in FIG. 12.

(Manufacturing Method: Two-Layer Memory Cell Configuration)

A method for manufacturing the nonvolatile semiconductor storage device according to the third embodiment is shown in FIGS. 18A to 25. In FIGS. 20A to 25, an array portion of the memory cells of the nonvolatile semiconductor storage device according to the third embodiment is described as MC. The manufacturing method described here is also applicable to the method for manufacturing the nonvolatile semiconductor storage device according to the fourth embodiment.

In the following description, the stacked films (121A, 122, 121B, 123, 124, 125, 126) form the memory cell 101, and thus may be simply referred to as a stacked film 101. The stacked films (221A, 222, 221B, 223, 224, 225, 226) form the memory cell 102, and thus may be simply referred to as a stacked film 102.

Figure 24:
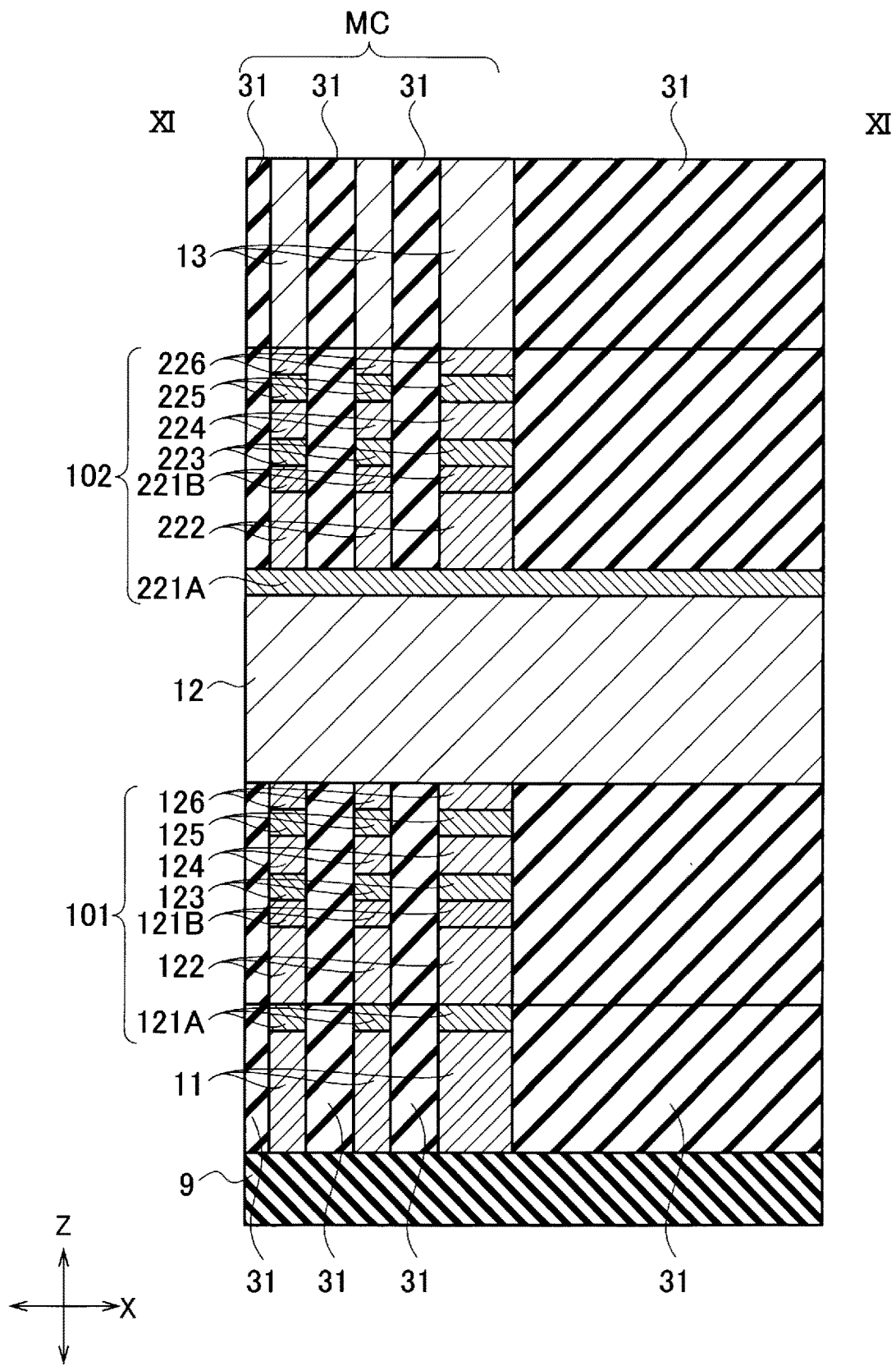
FIG. 24 is a schematic cross-sectional structural view taken along a line XI-XI of FIG. 19B in the method for manufacturing the nonvolatile semiconductor storage device according to the third embodiment.
Figure 25:
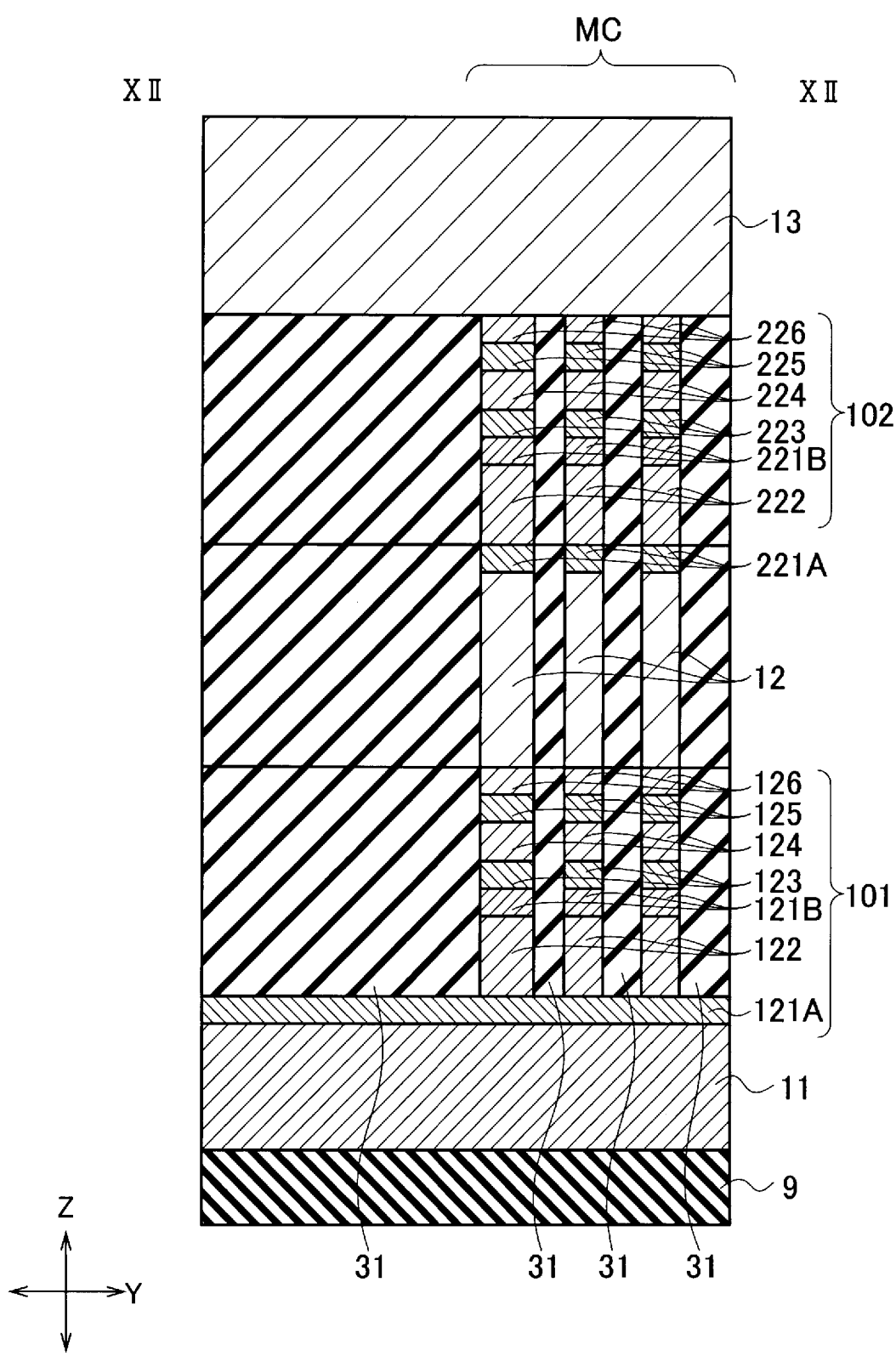
FIG. 25 is a schematic cross-sectional structural view taken along a line XII-XII of FIG. 19B in the method for manufacturing the nonvolatile semiconductor storage device according to the third embodiment.

As shown in FIGS. 24 and 25, the first memory cell 101 is disposed between the first wiring layer 11 and the second wiring layer 12, and further the second memory cell 102 is disposed between the second wiring layer 12 and the third wiring layer 13. That is, the memory cells are stacked in two layers.

As shown in FIGS. 24 and 25, the plurality of first wiring layers 11 extending in the Y direction and the plurality of second wiring layers 12 extending in the X direction intersecting the Y direction above the plurality of first wiring layers 11, and the first memory cell 101 disposed between the second wiring layer 12 and the first wiring layer 11 at portions where the plurality of second wiring layers 12 intersect the plurality of first wiring layers 11 are disposed.

Further, the plurality of third wiring layers 13 extending in Y direction above the plurality of second wiring layers 12, and the second memory cell 102 disposed between the third wiring layer 13 and the second wiring layer 12 at portions where the plurality of third wiring layers 13 intersect the plurality of second wiring layers 12 are disposed.

FIGS. 18A and 18B to FIGS. 19A and 19B each show a schematic plan pattern configuration with reference to which one step in the method for manufacturing the nonvolatile semiconductor storage device according to the third embodiment will be described.

Figure 18A:
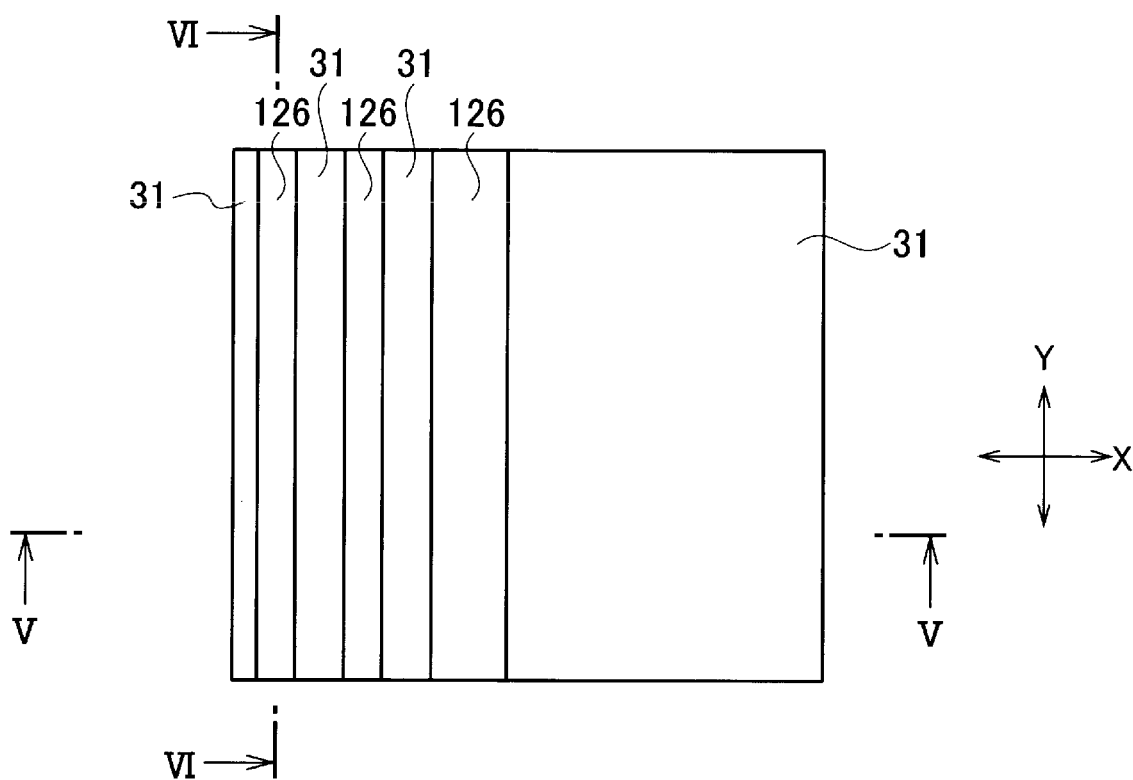
FIG. 18A is a schematic plan pattern configuration diagram illustrating a step in a method for manufacturing the nonvolatile semiconductor storage device according to the third embodiment (part 1).
Figure 20A:
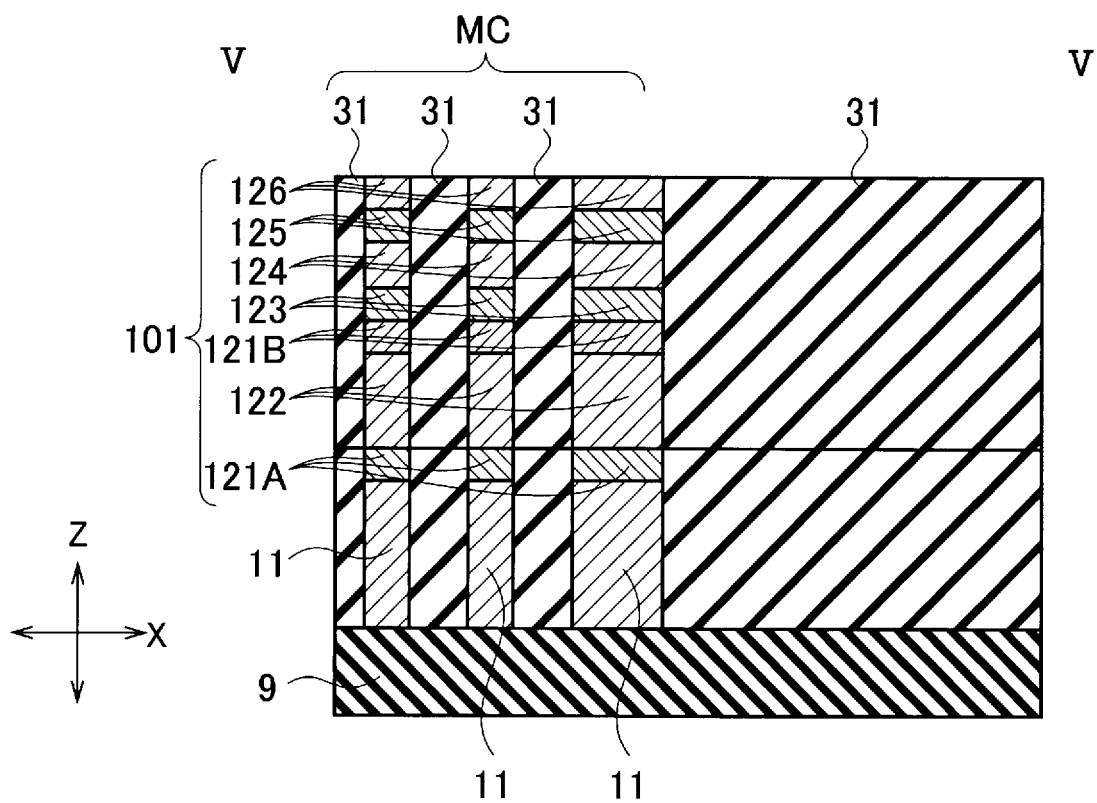
FIG. 20A is a schematic cross-sectional structural view taken along a line V-V of FIG. 18A in the method for manufacturing the nonvolatile semiconductor storage device according to the third embodiment.
Figure 20B:
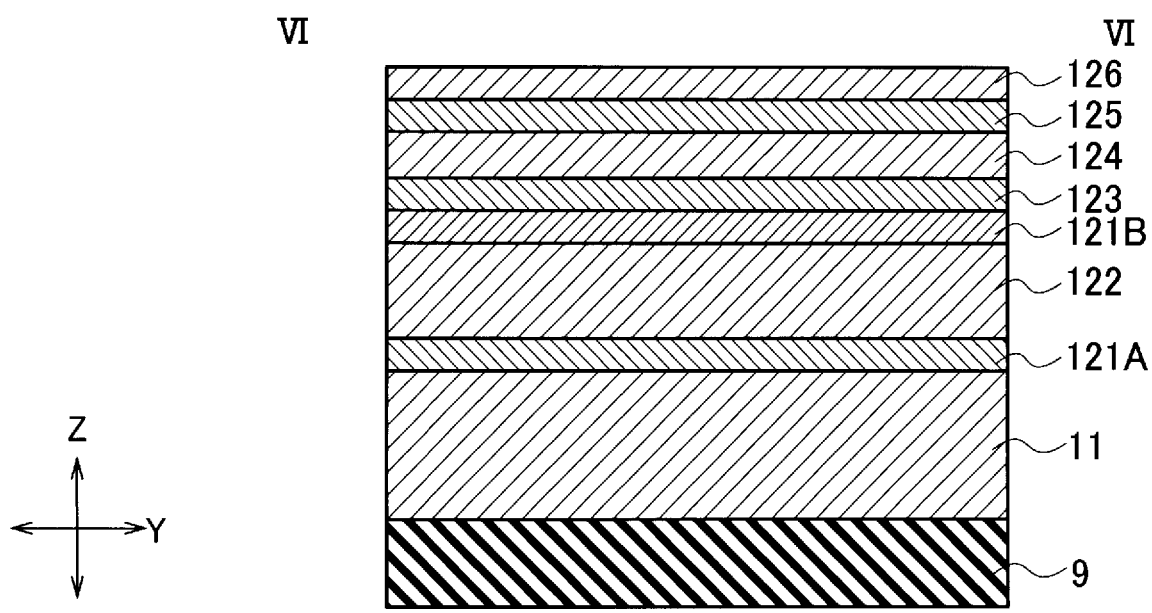
FIG. 20B is a schematic cross-sectional structural view taken along a line VI-VI of FIG. 18A in the method for manufacturing the nonvolatile semiconductor storage device according to the third embodiment.

A schematic cross-sectional structure taken along a line V-V of FIG. 18A is shown in FIG. 20A, and a schematic cross-sectional structure taken along a line VI-VI of FIG. 18A is shown in FIG. 20B.

(a) First, similar to FIG. 13A, the interlayer insulating film 31 is formed on the insulating substrate 9 and planarized by using a CMP technique or the like.

(b) Next, similar to FIG. 13B, the interlayer insulating film 31 is patterned at a predetermined pitch in the X direction, and the first wiring layer 11 is formed in the trench groove between the patterned interlayer insulating films 31.

(c) Next, similar to FIG. 15, the conductive layer 121A is formed on the first wiring layer 11, and an annealing processing is performed. The temperature of the annealing processing is in a range of 200° C. to 300° C. Thereafter, planarization is performed by CMP or the like.

(a1) In the modification of the third manufacturing method, similar to FIG. 14A, the first wiring layer 11 and the conductive layer 121A are formed on the insulating substrate 9, and an annealing processing is performed. The temperature of the annealing processing may be in a range of 200° C. to 300° C.

(b1) Next, similar to FIG. 14B, the first wiring layer 11 and the conductive layer 121A are patterned.

(c1) Next, similar to FIG. 15, the first interlayer insulating film 31 is formed in the trench groove between the first wiring layer 11 and the conductive layer 121A, and planarized by CMP or the like.

(d) Next, similar to FIG. 16A, the stacked films (122, 121B, 123, 124, 125, 126) are formed on the patterned conductive layer 121A and the interlayer insulating film 31. That is, the selector 122, the conductive film 121B, the conductive film 123, the resistance change film 124, the conductive film 125, and the electrode layer 126 are sequentially formed on the conductive layer 121A and the interlayer insulating film 31.

(e) Next, similar to FIG. 16B, the stacked films (122, 121B, 123, 124, 125, 126) and the interlayer insulating film 31 are processed. For example, the stacked films (122, 121B, 123, 124, 125, 126) on the conductive layer 121A are processed, by, for example, an RIE method, into a stripe structure extending in the Y direction. The stacked films (122, 121B, 123, 124, 125, 126) on the plurality of first wiring layers 11 and conductive layers 121A sandwich the trench in the X direction orthogonal to the Y direction.

Similar to FIGS. 9A, 9B and 9C, the stacked films (122, 121B, 123, 124, 125, 126) may be stacked on the first wiring layer 11 and the conductive layer 121A formed on the insulating substrate 9, and then the stacked films (122, 121B, 123, 124, 125, 126), the conductive layer 121A and the first wiring layer 11 may be simultaneously processed into a stripe structure extending in the Y direction.

(f) Next, the interlayer insulating film 31 is formed, and is planarized by using a CMP technique or the like. As a result, as shown in FIGS. 20A and 20B, the interlayer insulating film 31 is embedded in the trench between the stacked films (122, 121B, 123, 124, 125, 126) formed by the processing.

By, for example, a CMP method, the interlayer insulating film 31 deposited above the stacked film 101 is polished and removed and the upper surface of the interlayer insulating film 31 is planarized. As a result, as shown in FIGS. 20A and 20B, the upper surface of the electrode layer 126 is exposed.

Figure 18B:
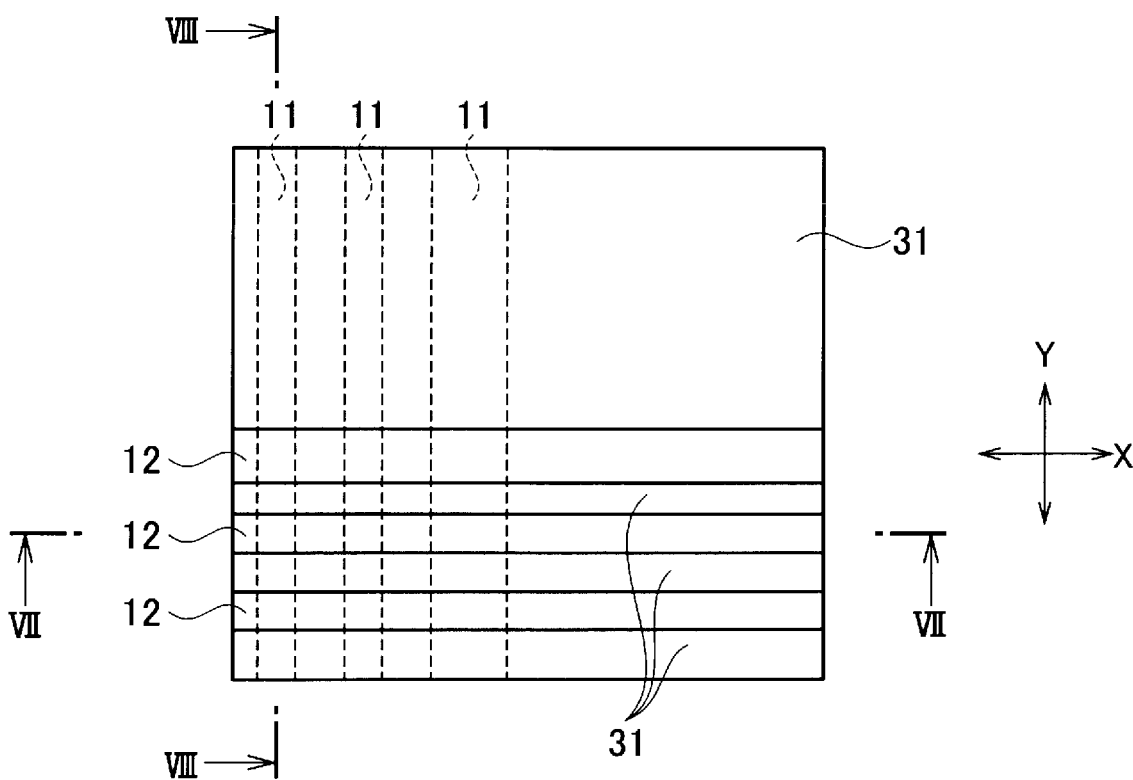
FIG. 18B is a schematic plan pattern configuration diagram illustrating a step in the method for manufacturing the nonvolatile semiconductor storage device according to the third embodiment (part 2).
Figure 21A:
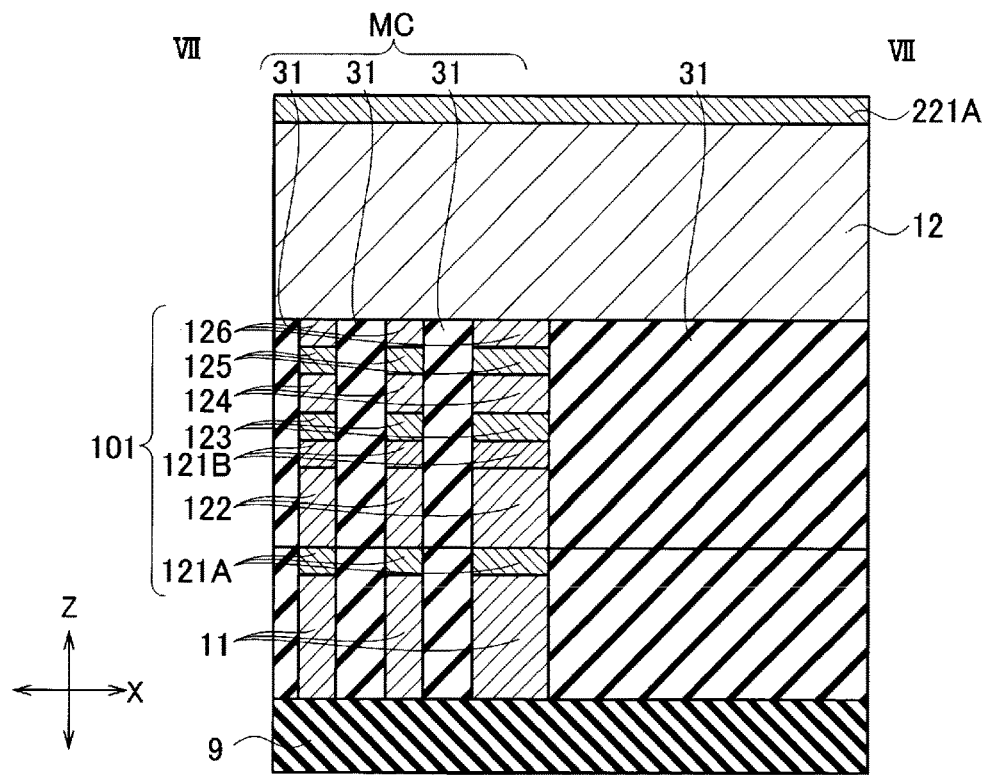
FIG. 21A is a schematic cross-sectional structural view taken along a line VII-VII of FIG. 18B in the method for manufacturing the nonvolatile semiconductor storage device according to the third embodiment.
Figure 21B:
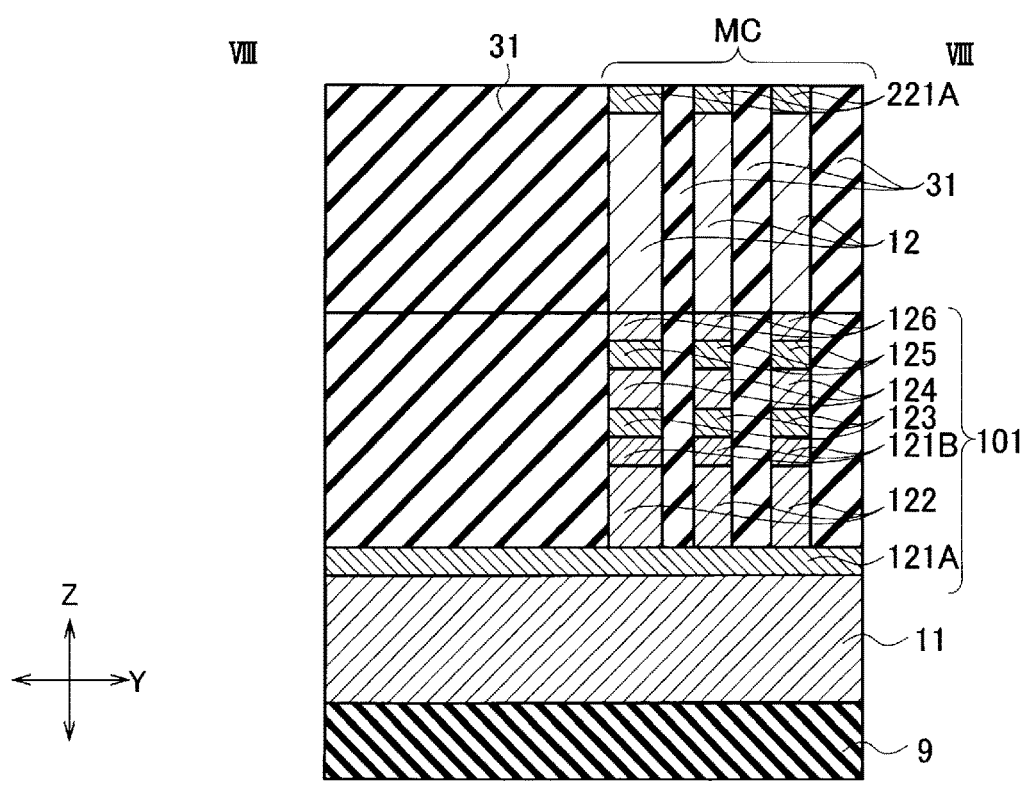
FIG. 21B is a schematic cross-sectional structural view taken along a line VIII-VIII of FIG. 18B in the method for manufacturing the nonvolatile semiconductor storage device according to the third embodiment.

A schematic cross-sectional structure taken along a line VII-VII of FIG. 18B is shown in FIG. 21A, and a schematic cross-sectional structure taken along a line VIII-VIII of FIG. 18B is shown in FIG. 21B.

(g) Next, similar to FIG. 10B, the second wiring layer 12 and the conductive layer 221A are formed, and an annealing processing is performed. The temperature of the annealing processing is in a range of 200° C. to 300° C.

(h) Next, similar to FIG. 11, the second wiring layer 12 and the conductive layer 221A are processed into a stripe structure extending in the X direction. As a result, the second wiring layer 12 is connected to the electrode layer 126 of the memory cell 101.

(i) Next, the stacked film 101 and the interlayer insulating film 31 below and between the second wiring layer 12 and the conductive layer 221A processed into the stripe structure are also processed by an RIE method, and the memory cell 101 including the stacked films (121A, 122, 121B, 123, 124, 125, 126) in a columnar shape is formed at the portion where the second wiring layer 12 intersect the first wiring layer 11.

(j) Next, the interlayer insulating film 31 is formed and planarized. As a result, as shown in FIGS. 21A and 21B, the second wiring layer 12 and the conductive layer 221A are stacked.

Figure 19A:
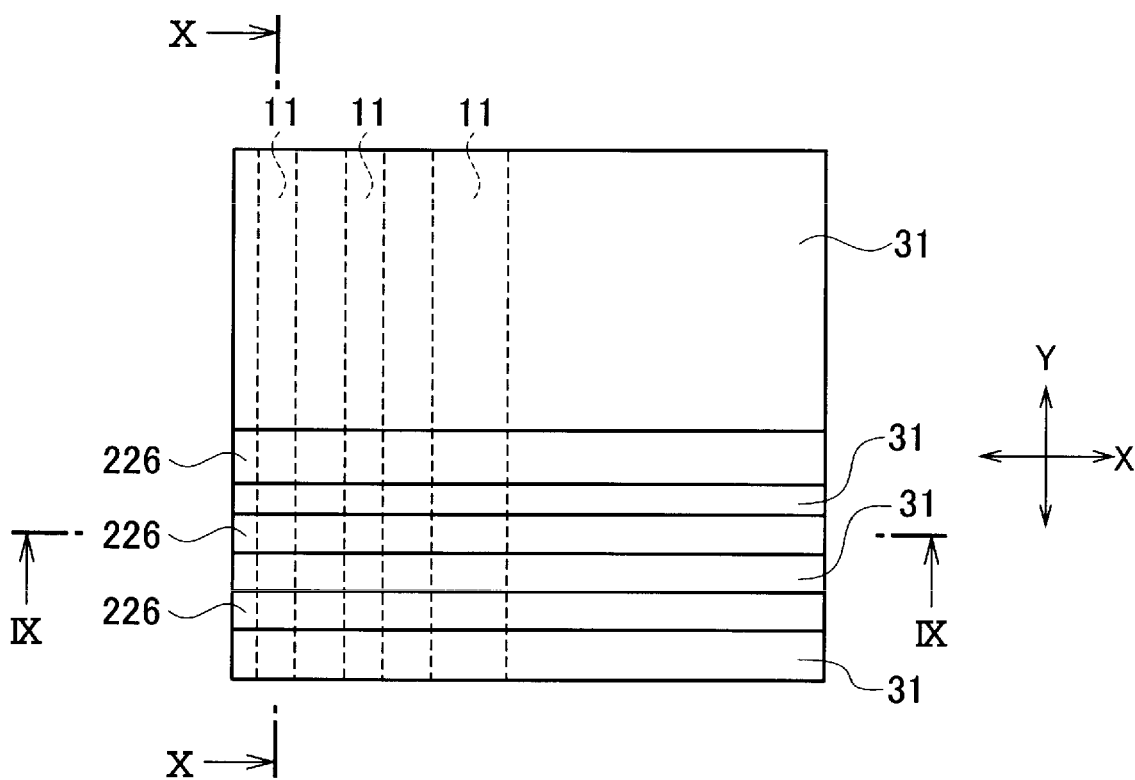
FIG. 19A is a schematic plan pattern configuration diagram illustrating a step in the method for manufacturing the nonvolatile semiconductor storage device according to the third embodiment (part 3).
Figure 22:
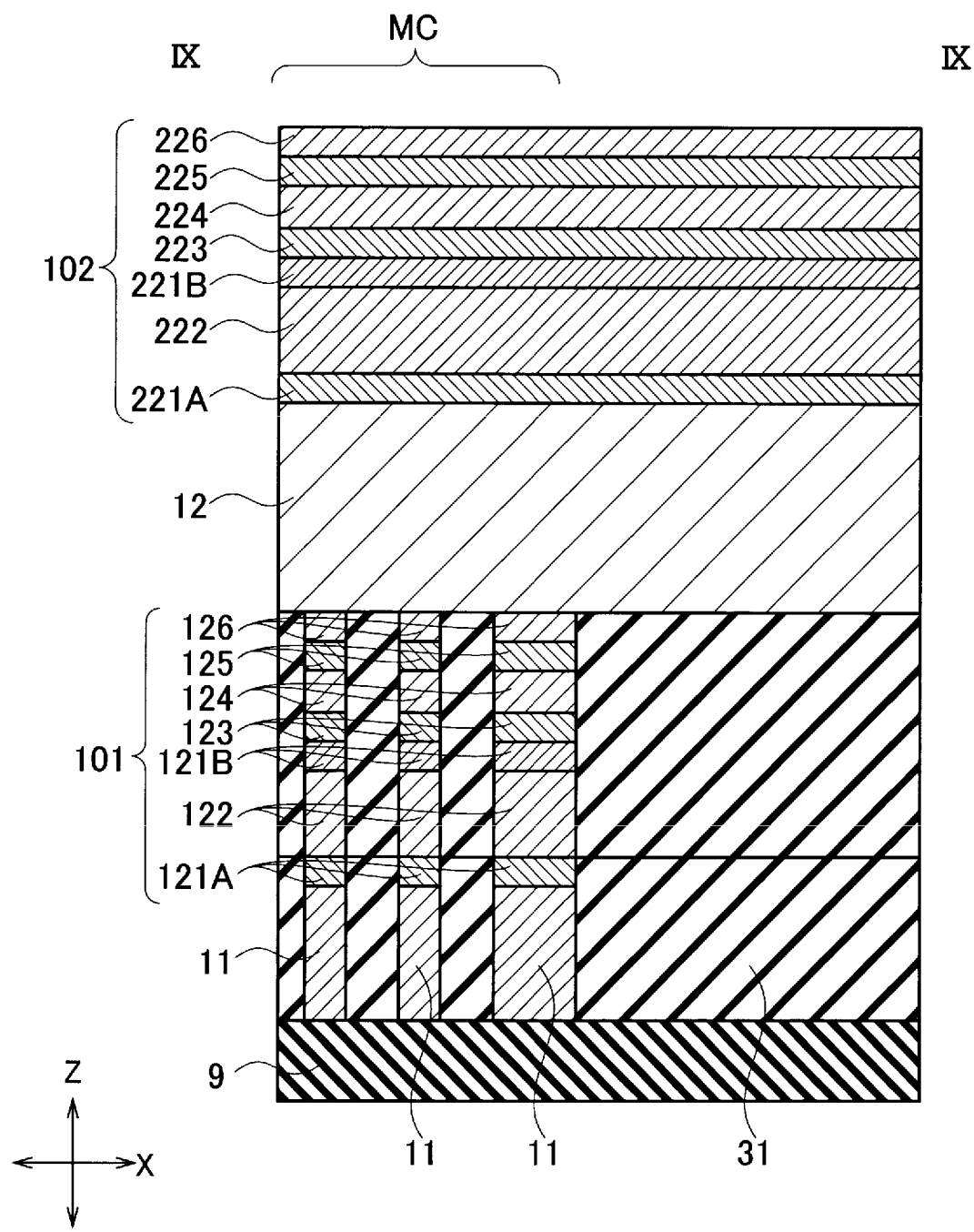
FIG. 22 is a schematic cross-sectional structural view taken along a line IX-IX of FIG. 19A in the method for manufacturing the nonvolatile semiconductor storage device according to the third embodiment.
Figure 23:
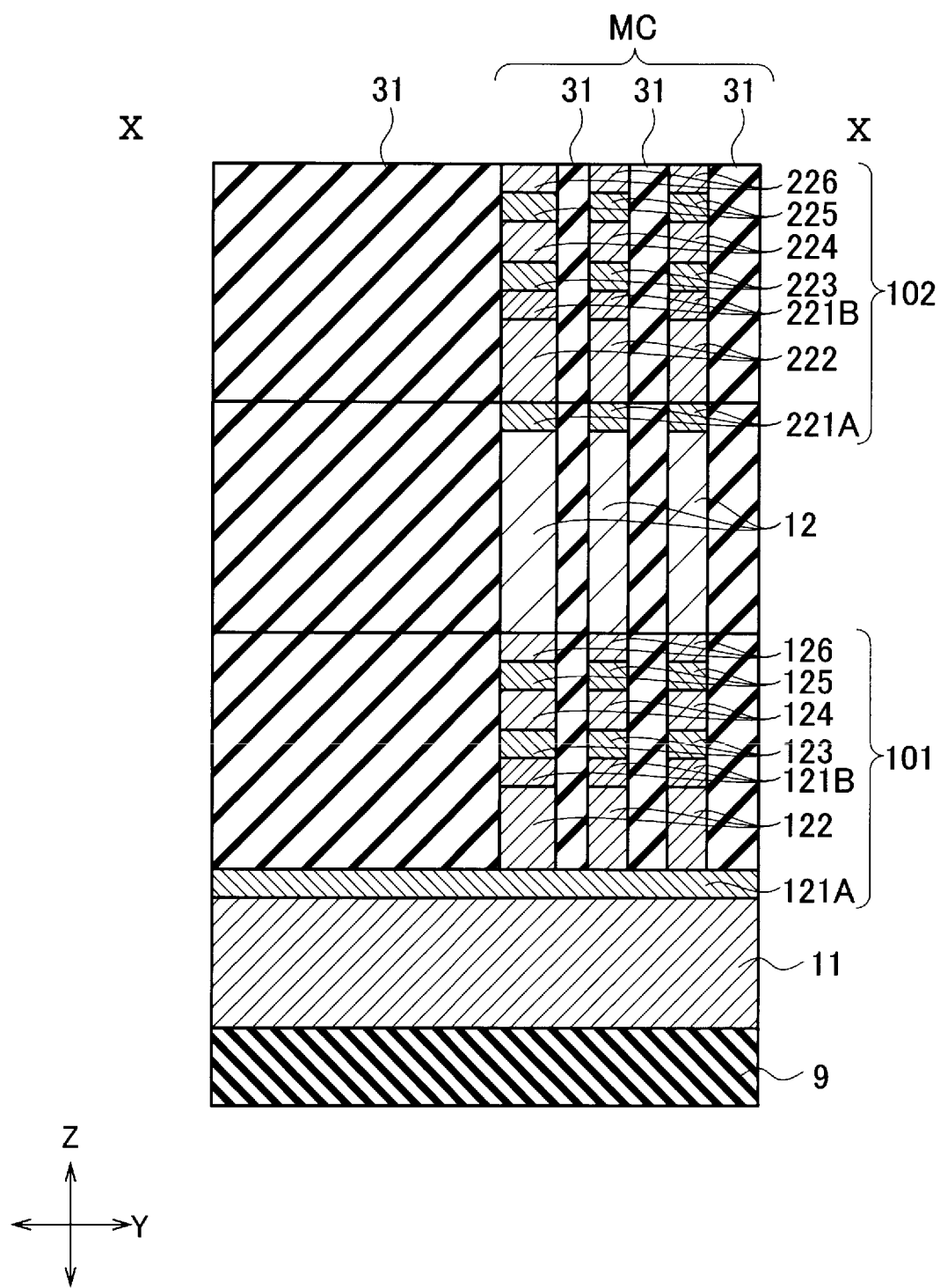
FIG. 23 is a schematic cross-sectional structural view taken along a line X-X of FIG. 19A in the method for manufacturing the nonvolatile semiconductor storage device according to the third embodiment.

A schematic cross-sectional structure taken along a line IX-IX of FIG. 19A is shown in FIG. 22, and a schematic cross-sectional structure taken along a line X-X of FIG. 19A is shown in FIG. 23.

(k) Next, as shown in FIG. 22, the stacked films (222, 221B, 223, 224, 225, 226) are sequentially formed on the conductive layer 221A and the interlayer insulating film 31. That is, the selector 222, the conductive film 221B, the conductive film 223, the resistance change film 224, the conductive film 225, and the electrode layer 226 are sequentially formed on the conductive layer 221A and the interlayer insulating film 31.

(l) Next, the stacked films (222, 221B, 223, 224, 225, 226) on the conductive layer 221A are processed into a stripe structure extending in the X direction. As a result, the stacked films (221A, 222, 221B, 223, 224, 225, 226) as the second memory cell 102 are formed.

(m) Next, the interlayer insulating film 31 is formed and planarized. As a result, as shown in FIGS. 22 and 23, the interlayer insulating film 31 is embedded in the trench between the stacked films 102 formed by the processing.

Figure 19B:
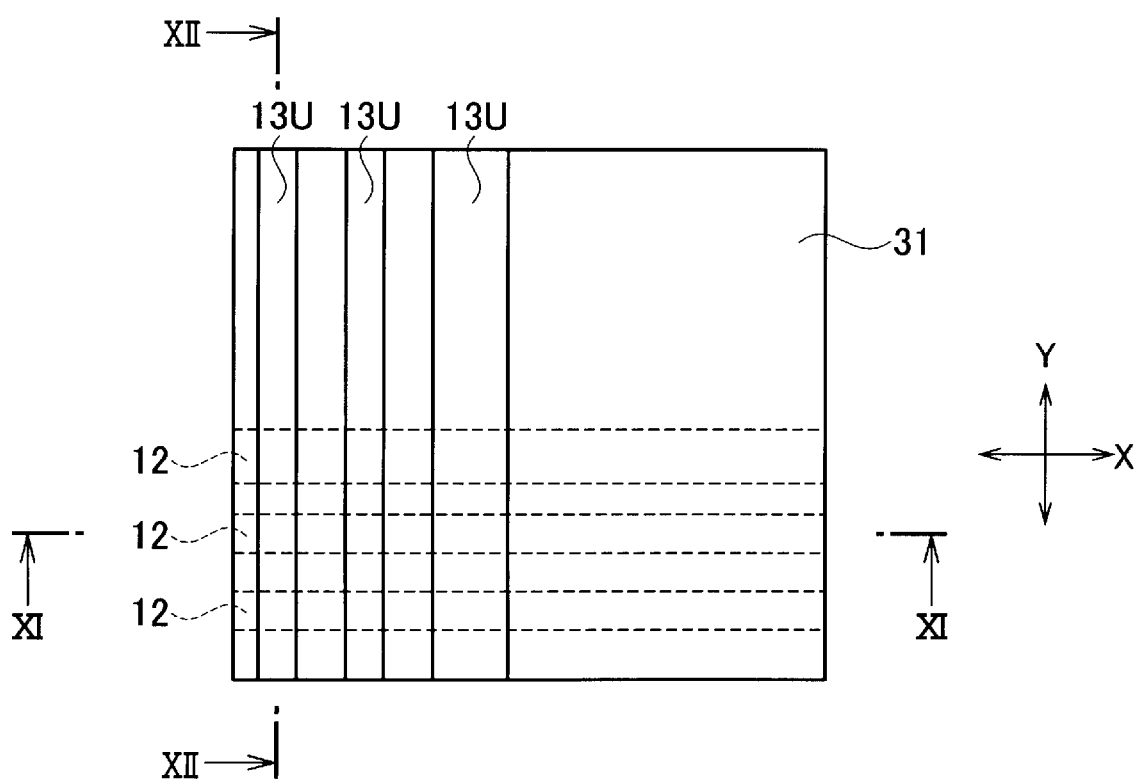
FIG. 19B is a schematic plan pattern configuration diagram illustrating a step in the method for manufacturing the nonvolatile semiconductor storage device according to the third embodiment (part 4).

A schematic cross-sectional structure taken along a line XI-XI of FIG. 19B is shown in FIG. 24, and a schematic cross-sectional structure taken along a line XII-XII of FIG. 19B is shown in FIG. 25.

(n) Next, the third wiring layer 13 is formed and patterned. The third wiring layer 13 is processed into a stripe structure extending in the X direction. As a result, the third wiring layer 13 is electrically connected to the electrode layer 226 of the memory cell 102. In the case of the two-layer memory cell configuration, the conductive layer 321A may not be formed on the third wiring layer 13. The conductive layer 321A may be formed on the third wiring layer 13 and an annealing processing may be performed on the assumption of further stacking.

(o) Next, the stacked film 102 and the interlayer insulating film 31 below and between the third wiring layer 13 processed into the stripe structure are also processed, and the memory cell 102 including the stacked films (221A, 222, 221B, 223, 224, 225, 226) in a columnar shape is formed at the portion where the third wiring layer 13 intersects the second wiring layer 12.

(p) Next, the interlayer insulating film 31 is formed and planarized.

(q) Similar to FIG. 17, after the steps shown in FIGS. 18A, 20A and 20B, the stacked films (122, 121B, 123, 124, 125, 126) on the conductive film 121A may be processed in the X direction intersecting the Y direction, and the stacked films (122, 121B, 123, 124, 125, 126) in a columnar shape may be formed.

(r) Next, the interlayer insulating film 31 is formed, and is planarized by using a CMP technique or the like. As a result, the interlayer insulating film 31 is embedded in the trench between the stacked films (122, 121B, 123, 124, 125, 126) in a columnar shape formed by the processing. Further, similar to FIGS. 21A and 21B, the second wiring layer 12 and the conductive layer 221A can be formed. The steps thereafter are similar to the above.

In the case of further forming layers, the above steps are repeated in accordance with the number of stacked memory cell arrays.

According to at least one embodiment, when the lower wiring layer and the conductive layer are formed in advance, the generation of the voids can be prevented by the annealing processing. Therefore, the heat resistance of the selector film is excellent, and the limit of the process temperature can be relaxed.

According to at least one embodiment, when the lower wiring layer and the conductive layer are formed in advance, the height of the wiring layer can be formed to be high, and the wiring resistance can be reduced for the fine wiring.

As described above, according to the nonvolatile semiconductor storage device according to the embodiments, it is possible to provide a nonvolatile semiconductor storage device and a manufacturing method thereof in which the wiring resistance is reduced.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A nonvolatile semiconductor storage device comprising:
    a plurality of first wiring layers extending in a first direction;
    a first conductive layer disposed on the plurality of first wiring layers and extending in the first direction;
    a plurality of second wiring layers, extending in a second direction intersecting the first direction, and disposed above the plurality of first wiring layers;
    a first memory cell disposed between the plurality of second wiring layers and the plurality of first wiring layers respectively where the plurality of second wiring layers intersect the plurality of first wiring layers, the first memory cell including a first cell unit having a first resistance change film and a first selector;
    a second conductive layer disposed on the plurality of second wiring layers and extending in the second direction;
    a plurality of third wiring layers extending in the first direction, and disposed above the plurality of second wiring layers;
    a second memory cell disposed between the plurality of third wiring layers and the plurality of second wiring layers respectively where the plurality of third wiring layers intersect the plurality of second wiring layers, and the second memory cell including a second cell unit and a second selector, the second cell unit having a second resistance change film;
    a plurality of fourth wiring layers disposed above the plurality of third wiring layers in a third direction perpendicular to the first direction and the second direction, and the plurality of fourth wiring layers extending in the second direction;
    a third memory cell disposed between the plurality of fourth wiring layers and the plurality of third wiring layers respectively, and including a third cell unit having a third resistance change film and a third selector; and
    an interlayer insulating film disposed between the first memory cell and the third memory cell, wherein
    the first selector is connected to the plurality of first wiring layers via the first conductive layer, and the second selector is connected to the plurality of second wiring layers via the second conductive layer.

2. The nonvolatile semiconductor storage device according to claim 1, wherein the interlayer insulating film is disposed between the first resistance change film and the third resistance change film.

3. The nonvolatile semiconductor storage device according to claim 1, further comprising:
    a first barrier conductive layer disposed on the first conductive layer; and
    a second barrier conductive layer disposed on the second conductive layer, wherein
    the first selector is connected to the first conductive layer via the first barrier conductive layer, and
    the second selector is connected to the second conductive layer via the second barrier conductive layer.

4. The nonvolatile semiconductor storage device according to claim 3, wherein the first barrier conductive layer and the second barrier conductive layer contain any material selected from a first group consisting of W, Mo, polysilicon, Ni, Co, Ti, and Cu, any silicide material containing a material selected from the first group, any nitride material containing a material selected from the first group, or a material having any mixing ratio of materials selected from the first group.

5. The nonvolatile semiconductor storage device according to claim 1, wherein the plurality of first wiring layers, the plurality of second wiring layers, and the plurality of third wiring layers contain any material selected from a first group consisting of W, Mo, polysilicon, Ni, Co, Ti, and Cu, any silicide material containing a material selected from the first group, any nitride material containing a material selected from the first group, or a material having any mixing ratio of materials selected from the first group.

6. The nonvolatile semiconductor storage device according to claim 1, wherein the first conductive layer and the second conductive layer contain any material selected from the group consisting of carbon, carbon nitride (CN), titanium nitride (TiN), W, Cu, and Al.

7. A nonvolatile semiconductor storage device comprising:
    a first wiring layer extending in a first direction;
    a first conductive layer disposed on the first wiring layer;
    a second wiring layer extending in a second direction and intersecting the first wiring layer in the second direction;
    a second conductive layer disposed on the second wiring layer;
    a third wiring layer disposed above the first wiring layer and the second wiring layer and extending in the first direction;
    a third conductive layer disposed on the third wiring layer;
    a fourth wiring layer disposed above the third conductive layer and extending in the first direction;
    a first memory cell disposed between the first conductive layer and the second wiring layer, the first memory cell including a first cell unit having a first resistance change film and a first selector;
    a second memory cell disposed between the second conductive layer and the third wiring layer, the second memory cell including a second cell unit having a second resistance change film and a second selector; and
    an interlayer insulating film disposed between the first memory cell and the second memory cell.

8. The nonvolatile semiconductor storage device according to claim 7, further comprising:
   a first barrier conductive layer disposed on the first conductive layer; and
   a second barrier conductive layer disposed on the second conductive layer, wherein
   the first selector is connected to the first conductive layer via the first barrier conductive layer, and the second selector is connected to the second conductive layer via the second barrier conductive layer.

9. The nonvolatile semiconductor storage device according to claim 7, further comprising:
   a third memory cell disposed between the fourth wiring layer and the third conductive layer, the third memory cell including a third cell unit having a third resistance change film and a third selector.

10. The nonvolatile semiconductor storage device according to claim 7, wherein the interlayer insulating film is disposed between the first resistance change film and the second resistance change film.

* * * * *